United States Patent [19]

Yamazaki

[11] 4,328,432
[45] May 4, 1982

[54] ANTI-BLOOMING CHARGE TRANSFER DEVICE

[75] Inventor: Hiroshi Yamazaki, Ebina, Japan

[73] Assignee: Sony Corporation, Tokyo, Japan

[21] Appl. No.: 225,185

[22] Filed: Jan. 14, 1981

Related U.S. Application Data

[63] Continuation of Ser. No. 59,749, Jul. 23, 1979, abandoned.

[30] Foreign Application Priority Data

Jul. 26, 1978 [JP] Japan ................................. 53-91265

[51] Int. Cl.³ .................. G11C 19/28; H03K 3/42; H01L 29/78; H01L 27/14
[52] U.S. Cl. .................. 307/221 D; 307/311; 357/24; 357/30
[58] Field of Search .............. 357/24, 30; 307/221 D, 307/311

[56] References Cited

U.S. PATENT DOCUMENTS 3,931,465  1/1976  Levine ................................. 357/24

*Primary Examiner*—Gene M. Munson
*Attorney, Agent, or Firm*—Hill, Van Santen, Steadman, Chiara & Simpson

[57] ABSTRACT

A charge transfer image sensor device having an anti-blooming function is disclosed. The device comprises a semiconductor substrate, a plurality of sensor region which store signal charges in response to the incident radiation during a predetermined period, a shift register to read out the stored signal charges. The anti-blooming function is achieved by applying alternately voltage to the area adjacent to the sensor regions during a predetermined period to put the surface of the semiconductor substrate into an accumulation or depletion state. The electrons trapped at the surface state are recombined with majority carriers of the substrate when the area is an accumulation area and the excess signal charges are trapped at the surface state which is vacant by the previous recombination when the area is a depletion area. Thus the excess charges are removed through the surface state which results in anti-blooming.

8 Claims, 50 Drawing Figures

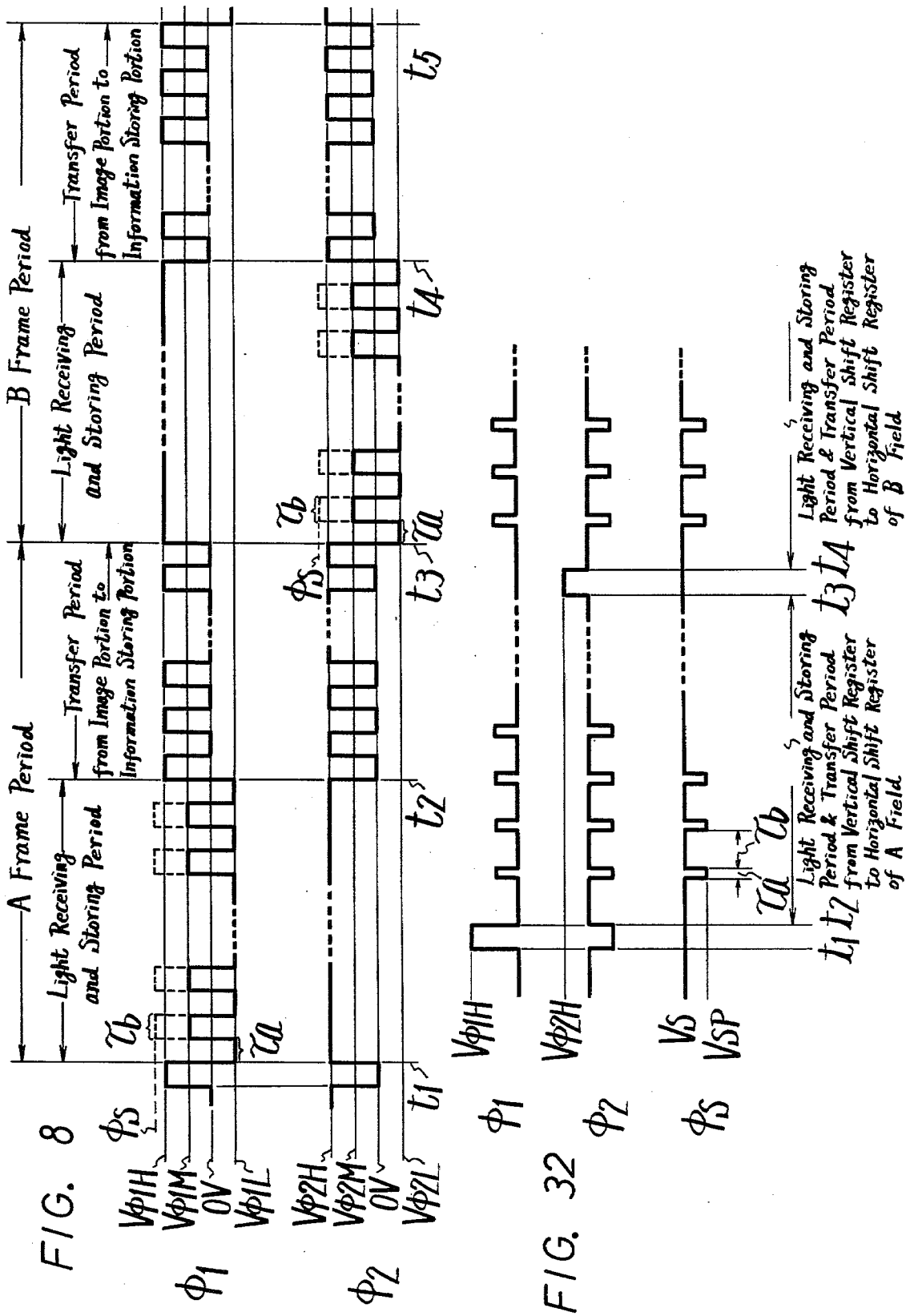

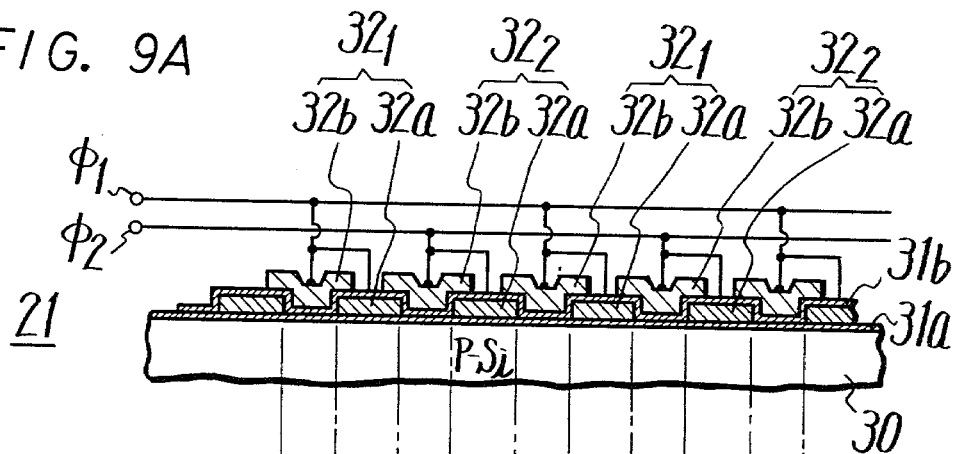
FIG. 9A
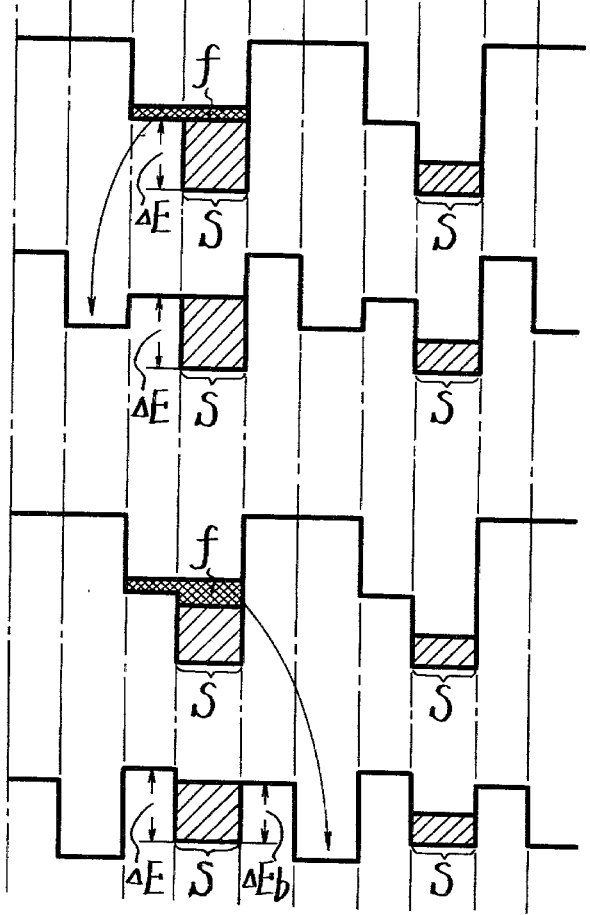
FIG. 9B State of $C_a$
FIG. 9C State of $C_b$
FIG. 9D State of $C_a$
FIG. 9E State of $C_b$

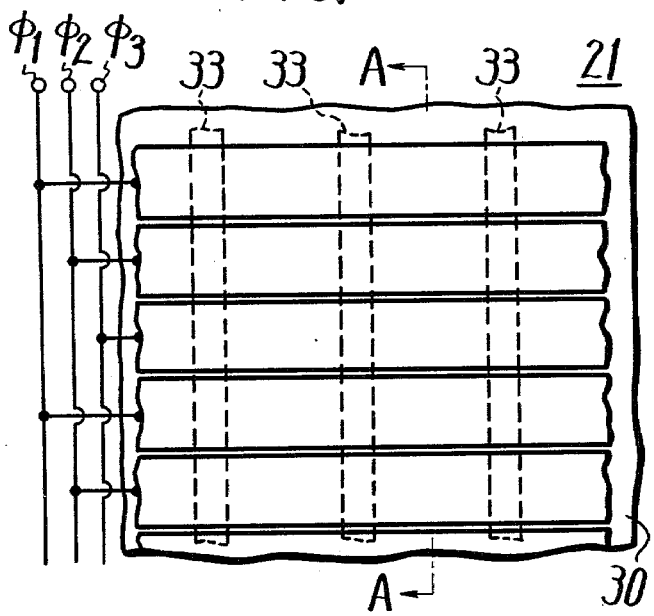
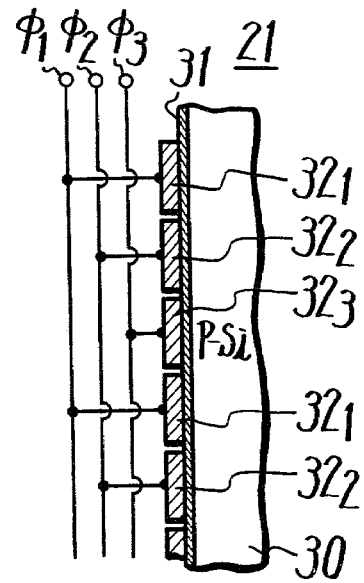
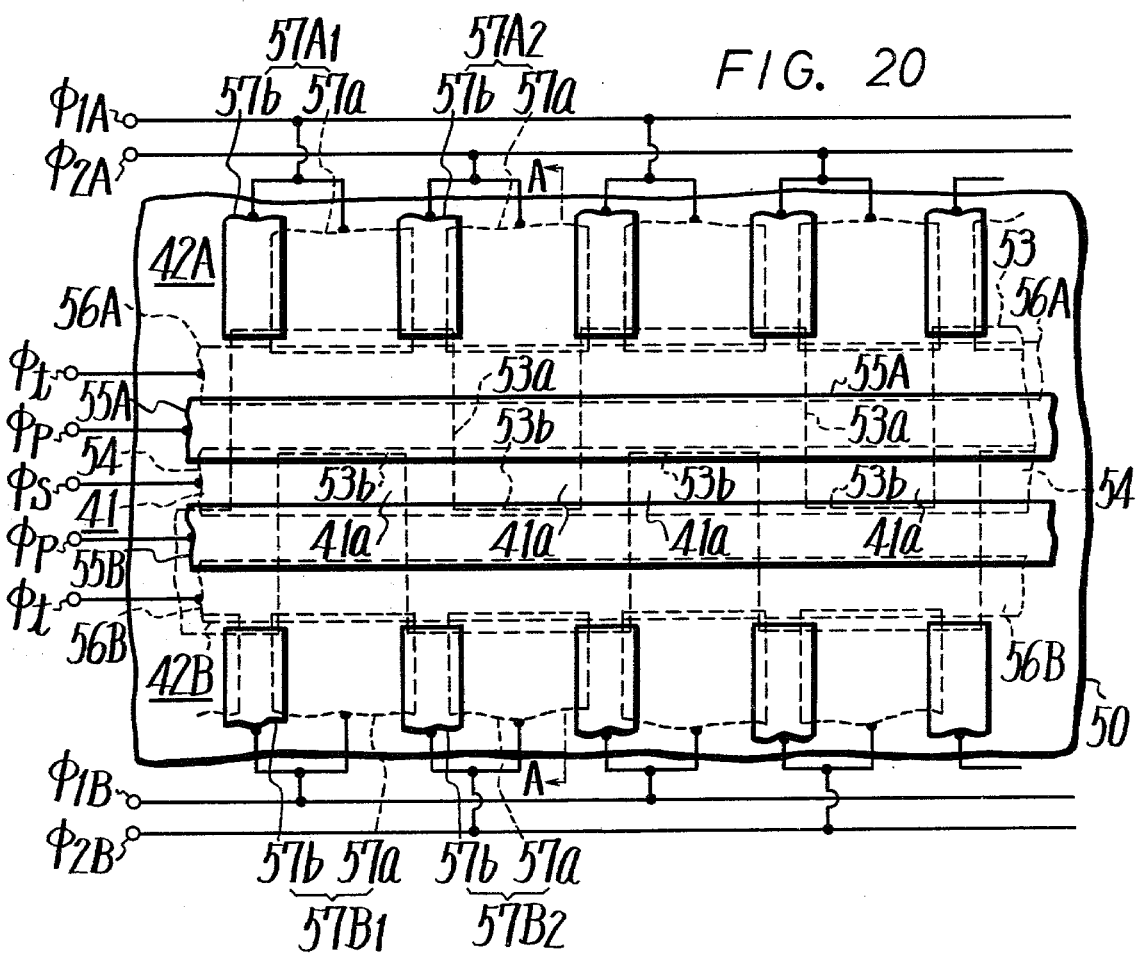

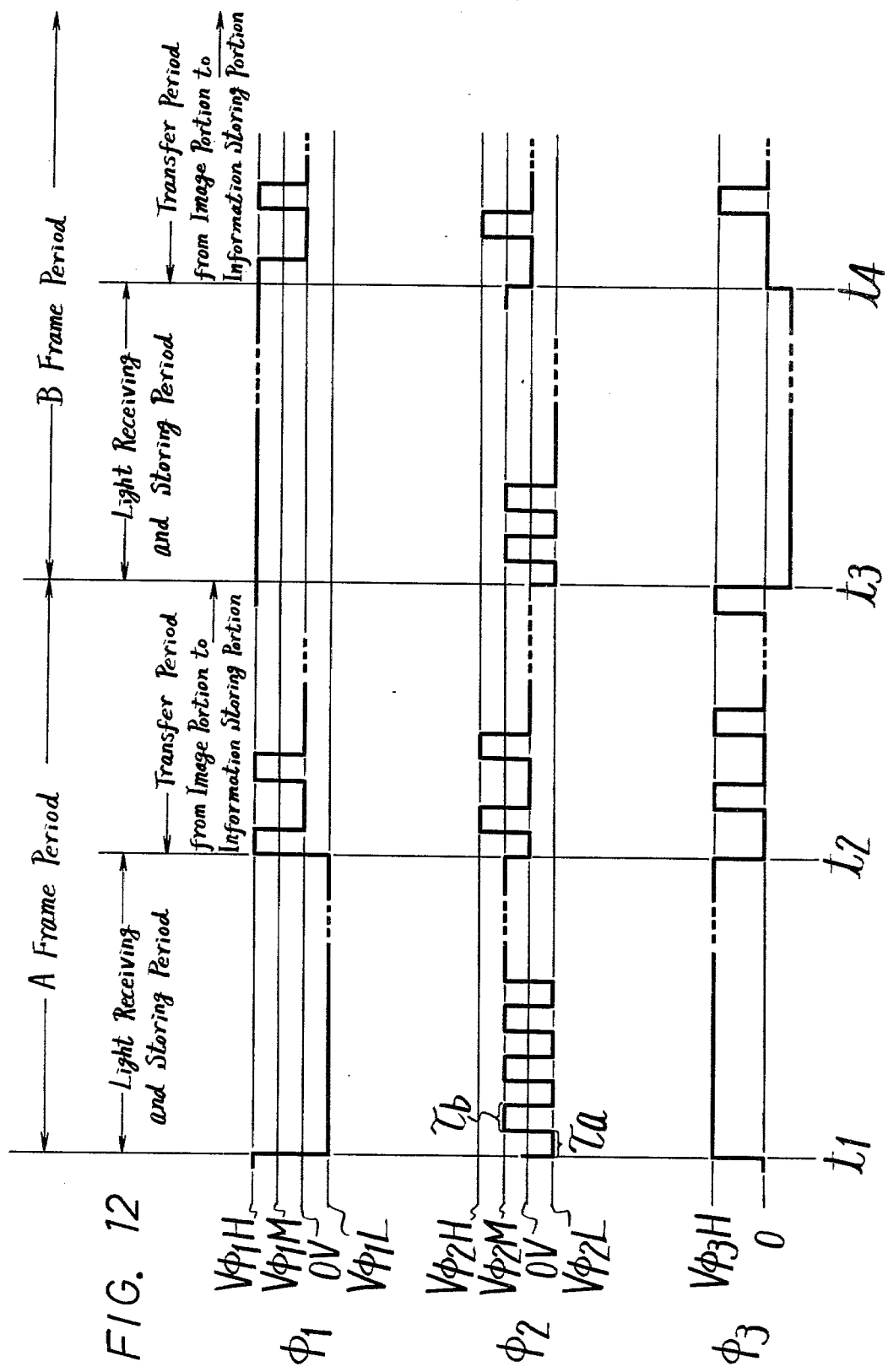

FIG. 13A
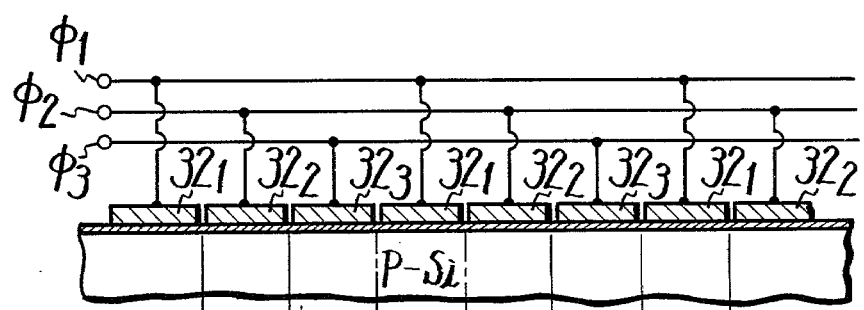
FIG. 13B
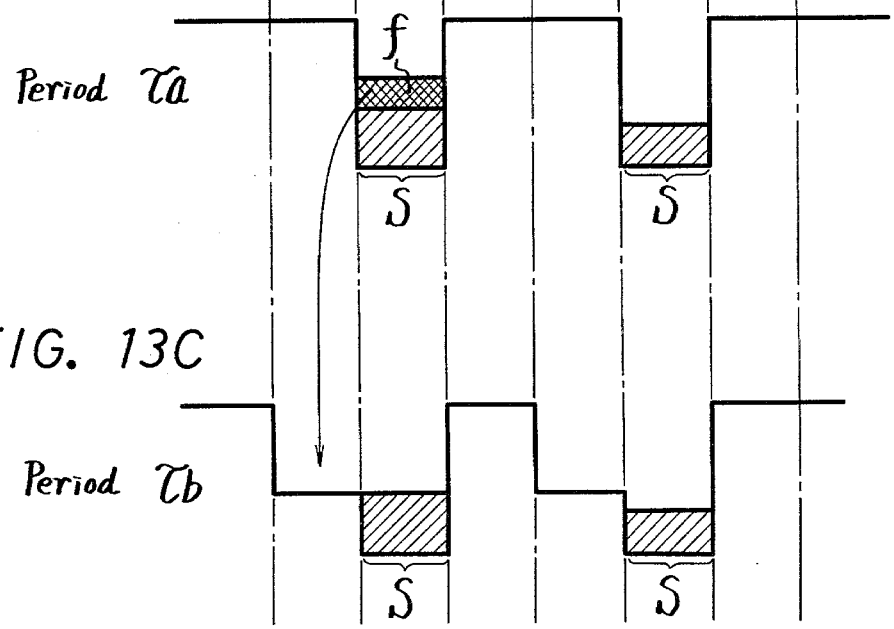
FIG. 13C

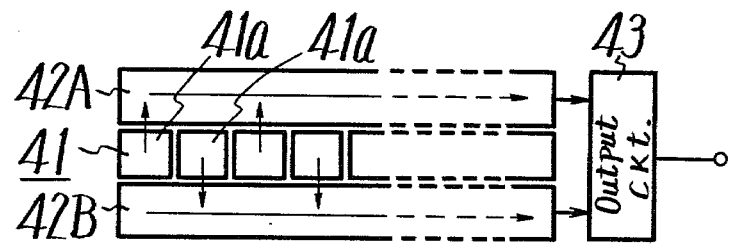
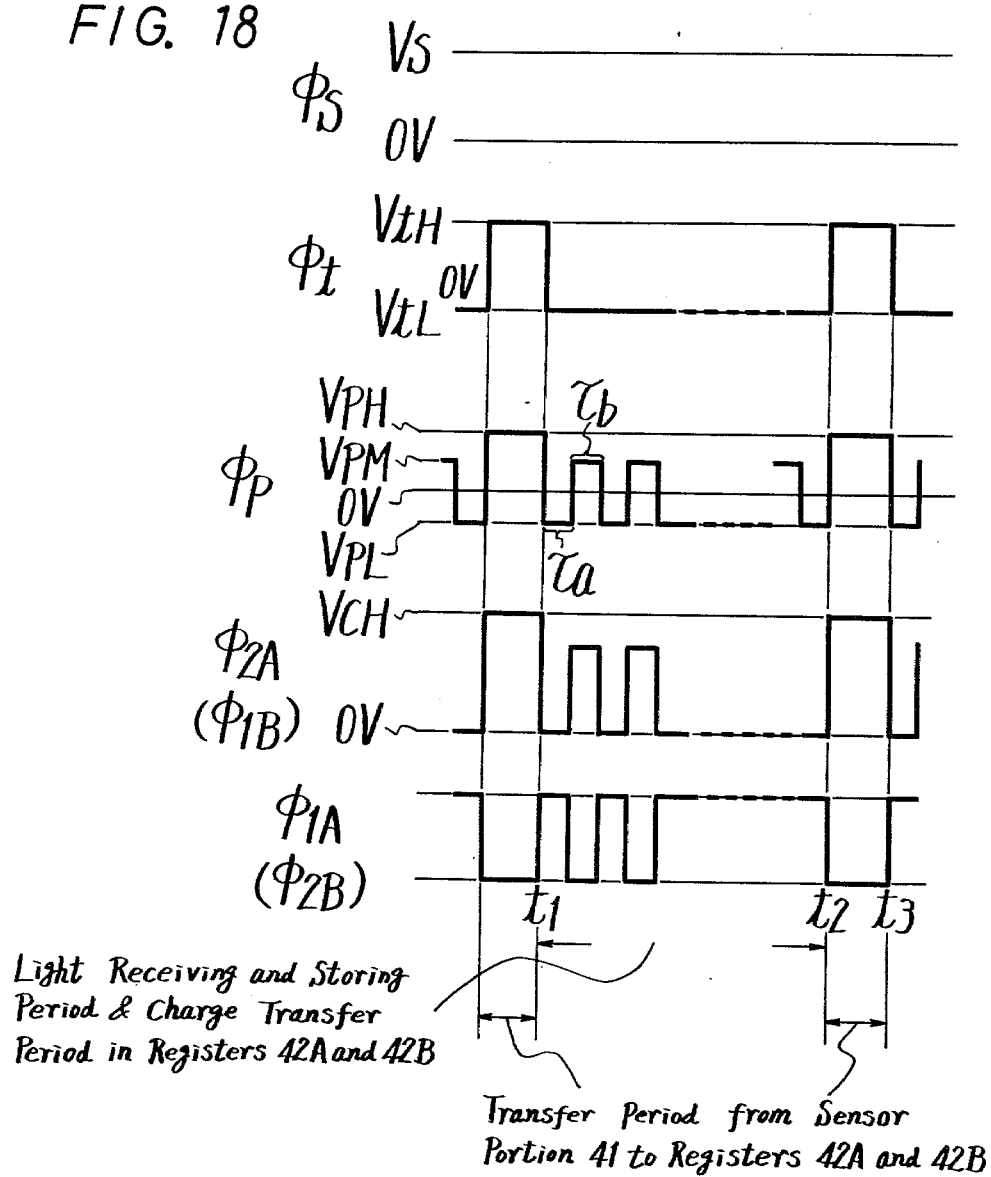

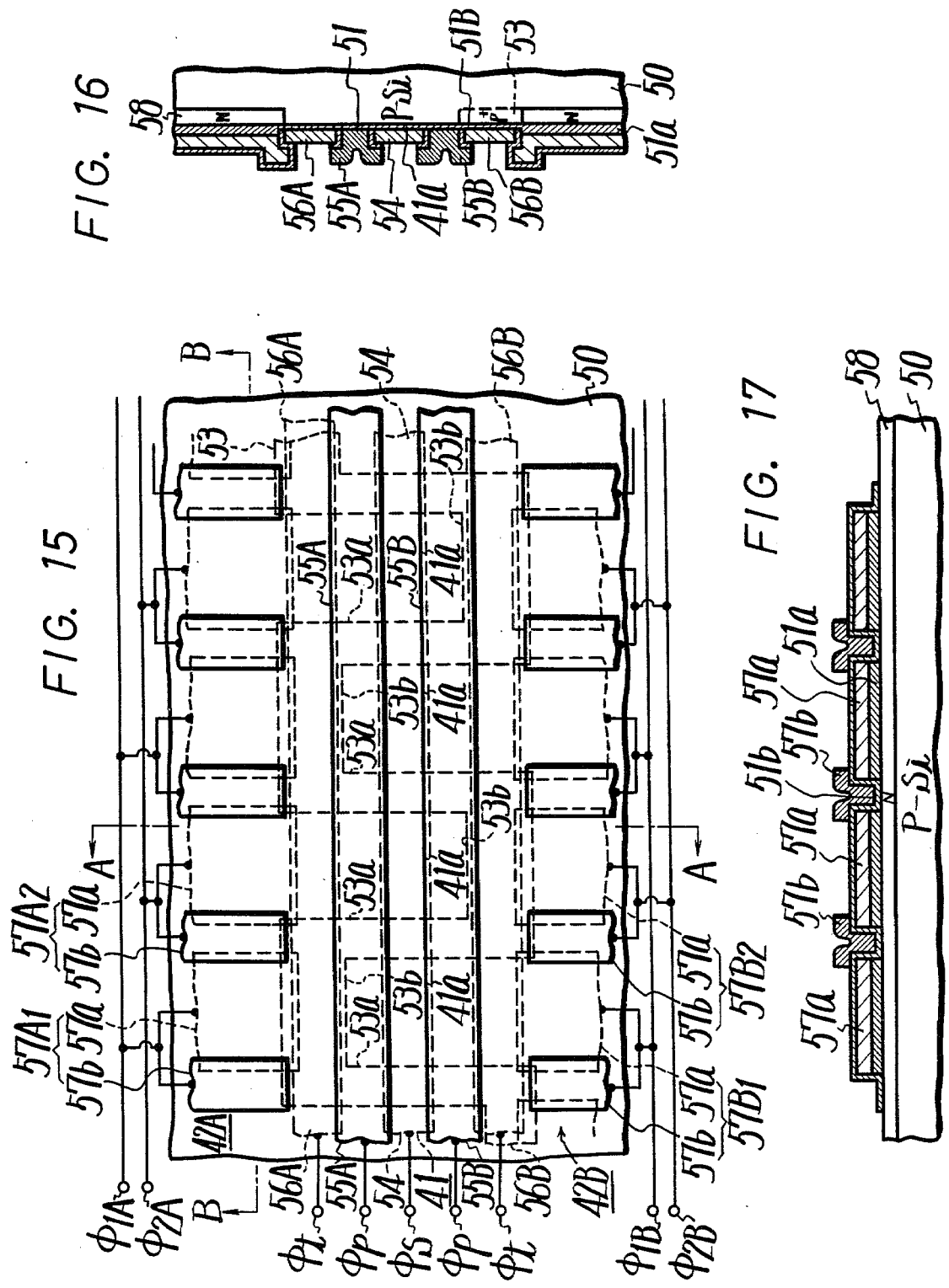

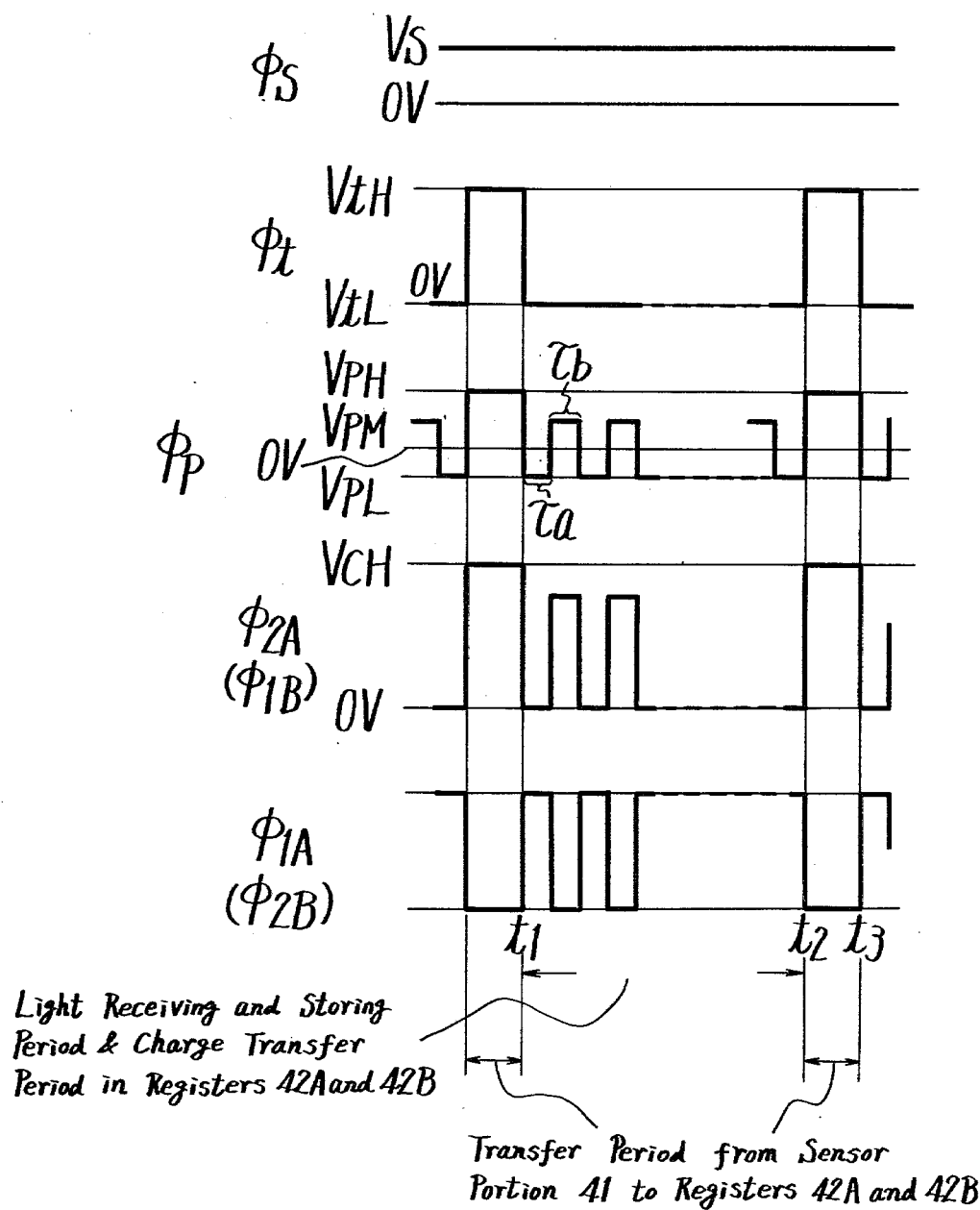

Period τa

Period τb

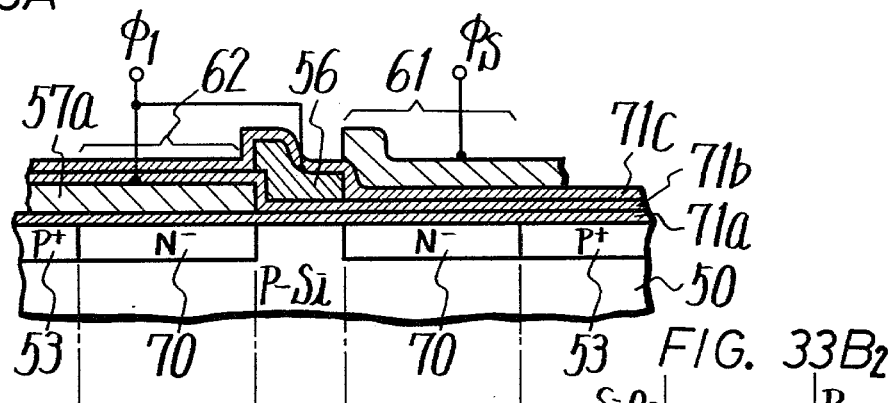
FIG. 33A
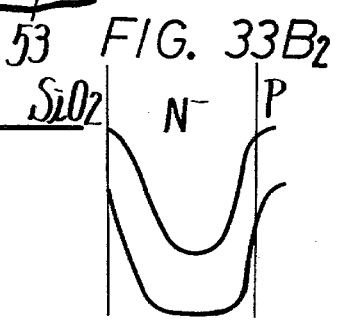
FIG. 33B₁
FIG. 33C₁
FIG. 33D
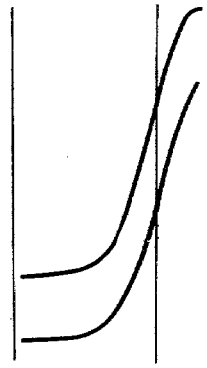

//  4,328,432

ANTI-BLOOMING CHARGE TRANSFER DEVICE

This application is a continuation of Ser. No. 059,749, filed July 23, 1979, now abandoned.

BACKGROUND OF THE INVENTION

1. Field of the Invention

The present invention related generally to a charge transfer device, and is directed more particularly to a charge transfer device suitable for use with a solid state image sensor.

2. Description of the Prior Art

In a solid state image sensor there is provided a charge carrier storage portion which may store a charge carrier in response to the received light amount during the light receiving period. In such the solid state image sensor, when an excess charge carrier, which exceeds an amount of charge capable of being stored in the storage portion, is locally or partially generated, the excess carrier will flow to other storage portions or other picture elements to cause blooming.

In order to avoid the generation of the blooming, there has been proposed various methods for the formation of a solid state image sensor which will remove the excess carriers.

For example, in a solid state image sensor of the frame transfer system which uses a surface channel charge transfer device, an excess charge is injected in the form of minority carrier to a substrate (bulk) region.

Now, turning to FIG. 1, a prior art surface channel charge transfer device of the two-phase type will be now described. In the example of FIG. 1, there is provided a semiconductor substrate, for example, silicon substrate 1 of the P-type. On one surface of the silicon substrate 1 there is provided an insulating layer 2 on which a plurality of electrodes 3A and 3B are formed. Every other electrode are made as sets, and clock voltages $\phi 1$ and $\phi 2$ are applied to two sets of electrodes 3A and 3B, respectively. In this case, the thickness of the insulating layer 2 beneath the respective electrodes 3A and 3B, 3 is so selected that it is different at the front and rear stages with respect to the charge transfer direction to produce an asymmetrical surface potential. The charge is transferred by the two-phase clocks in a predetermined direction or in the direction of arrow a in FIG. 1. During the light receiving period, one of the electrode sets, for example, electrode set 3A is supplied with, for example, a predetermined negative voltage and hence the substrate surface beneath the electrode set 3A is caused to be in an accumulation state for the majority carrier, while the other electrode set 3B is supplied with, for example, a positive predetermined voltage and hence the substrate surface beneath the electrode set 3B is put in a depletion state or an inversion state. At this time, the potential becomes as indicated by a solid line b in FIG. 1, and the potential in the accumulation state is a little higher (shallower) than the substrate potential indicated by a broken line c in FIG. 1. Accordingly, under such a state when light is irradiated on the substrate 1 from, for example, its rear surface and charge carriers are generated therein in response to the received light amount, the minority carriers are stored in the potential well beneath the electrode set 3B i.e. storage portion for the minority carrier with the amount being in response to the received light. In this case, if a charge carrier whose amount is greater than the charge supplied by the storage portion is produced, an excess charge does not flow on the accumulation surface but is injected into the bulk substrate whose state is lower than the accumulation surface in the form of minority carriers. As set forth, the excess carrier flows to the bulk substrate to avoid having excess charge flows to the other storage portions i.e. to other picture elements, or the excess charge is transferred together with the charges of the other picture element. In this case, however, the excess charge is injected into the bulk substrate as minority carriers and diffused in the bulk substrate equally in all directions, so that part of the carrier arrives at the storage portions of other picture elements and is caught thereby. Thus, the above prior art method can not remove the blooming phenomenon completely.

Also, in a solid state image sensor of the inter-line transfer system, as shown in FIG. 2, there is provided a semiconductor substrate, for example, silicon substrate 11 of the P-type. On one surface of the silicon substrate 11 there is provided an insulating layer 12 on which a sensor electrode 13 made of, for example, a transparent electrode material is formed to receive light. Thus, there is formed a sensor portion for storing the charges proportioned to the amount of the received light i.e. light receiving and storage portion. In this case, adjacent the sensor portion there is provided an overflow drain region 14 of the opposite conductivity type from that of the substrate 11, for example, N-type region which faces the surface of the substrate 11. Further, a transfer gate electrode 15 is provided between a shift register portion (not shown) and the sensor portion.

With the above prior art solid state image sensor of FIG. 2, during the light receiving state, the sensor electrode 13 is supplied with, for example, a positive predetermined voltage. In this case, for example, the thickness of the insulating layer 12 is varied so that there is provided a portion in which a potential well indicated by a solid line part d1 of a solid line d showing a surface potential distribution of the substrate 11 in FIG. 2 is produced i.e. the storage portion for the minority carriers and also a portion which forms a potential barrier indicated by a solid line part d2 of the line d between the storage portion and the overflow drain region 14. Thus, excess charges in the storage portion which are more than can be held by the storage portion which is determined by the barrier d2 are absorbed into the overflow drain region 14 as indicated by an arrow e in FIG. 2. However, the provision of the overflow drain region 14 as set forth above results in a manufacturing process which is complicated and also, due to the provision of the region 14 in the substrate 11 which has a different conductivity type than the region 11 and also due to the portion for the electrode required to supply a necessary voltage to the region 14, an excess area in the substrate 11 occurs the elements cannot be increased to handle higher charge density.

OBJECT AND SUMMARY OF THE INVENTION

It is an object of the present invention to provide an improved charge transfer device.

It is another object of the present invention to provide a charge transfer device with anti-blooming function.

It is a further object of the present invention to provide a novel solid state image sensor with anti-blooming function which has a simple construction.

It is still further object of the present invention to provide a solid state image sensor having an anti-blooming function with high integration density of sensor elements.

According to one aspect of the present invention there is provided a charge transfer device which comprises, a semiconductor substrate, a storage means having a number of storing portions separately provided on said substrate for storing charge carriers during a predetermined period, a transfer means for transferring said charge carriers; a barrier means for preventing said carriers stored in said storing portions from being moved in said predetermined period, and a means for removing excess carriers exceeding a constant amount. The means for removing has first and second potential applying means for applying first and second potentials at predetermined regions of said substrate alternately during said predetermined period, and said first potential is selected to be a potential such that majority carriers of said substrate which will be recombined with charges trapped at surface states are induced on a surface of said substrate, and said second potential is selected such that excess charge carriers are trapped by said surface states.

BRIEF DESCRIPTION OF THE DRAWINGS

FIG. 8 is a diagram showing voltages which are used to operate the charge transfer device of the invention shown in FIGS. 6 and 7;

FIGS. 9A to 9E are a potential diagram used for explaining an operation of the device of the invention shown in FIGS. 6 and 7;

FIG. 10 is a plan view showing, in an enlarged scale, the essential part of another example of the device according to the invention;

FIG. 11 is a cross-sectional view taken along the line A—A in FIG. 10;

FIG. 12 is a voltage diagram used for operating the example shown in FIGS. 10 and 11;

FIG. 13 is a potential diagram used for explaining an operation of the example shown in FIGS. 10 and 11;

FIG. 14 is a plan view schematically showing a further example of the invention;

FIG. 15 is a plan view showing, in an enlarged scale, the essential part of the example of FIG. 14;

FIGS. 16 and 17 are cross-sectional views taken on the lines A—A and B—B in FIG. 15, respectively;

FIG. 18 is a voltage diagram used for operating the example shown in FIGS. 14 to 17;

FIG. 20 is a plan view schematically showing, in an enlarged scale, a still further example of the invention;

FIG. 21 is a voltage diagram used for operating the example shown in FIG. 20;

FIG. 32 is a voltage diagram; and

FIG. 33 is a potential and band model diagram.

DESCRIPTION OF THE PREFERRED EMBODIMENTS

The present invention, in which excess charge carriers which are more than the charge capacity of a light receiving and storing portion are recombined with the majority carries through the surface state so as to be cancelled, will be described with reference to the drawings.

Figure 3:
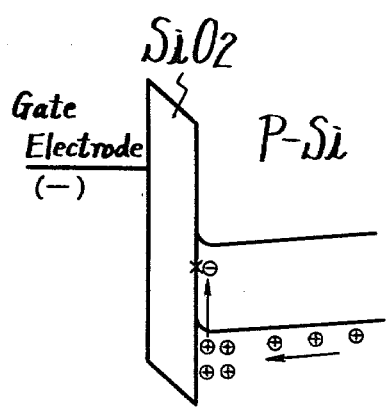
FIGS. 3 and 4 are explanatory diagrams showing manners to cancel a surface channel excess carrier according to the present invention.
Figure 4:
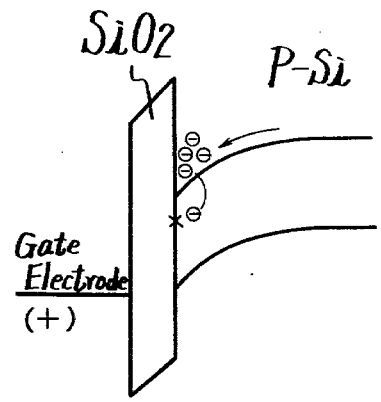

With reference to FIGS. 3 and 4, the mechanism of the invention, which removes and then cancels the excess carriers, especially the excess carriers in a charge storage portion on the surface channel, will be described.

FIGS. 3 and 4 show the energy band model of MOS-construction in which an insulating layer of $SiO_2$ is coated on a silicon substrate P-Si of the P-type and a gate electrode is formed on the insulating layer. With this structure, a predetermined voltage, which is negative with respect to the substrate P-Si, is applied to the gate electrode to place the surface of the substrate in an accumulation state (refer to FIG. 3). Thus, an electron (−) which is a minority carrier of the substrate, and is trapped by the surface state (recombination center) marked with x, is rapidly recombined with a hole (+) and hence almost no electrons exist on the surface state. Next, when a positive predetermined voltage is applied to the gate electrode to place the surface of the substrate of P-Si in a depletion state (refer to FIG. 4) and at the same time to move the excess charge (electron) to the surface of the substrate, the electron (−) is rapidly trapped by the surface state where no electron is trapped by the previous recombination. The surface potential at this time becomes an absorption voltage for for the excess charge (electron). In the strict sense, a part of the trap is filled by the electrons thermally excited from the valence band. However, if the time of the depletion state is short, its ratio can be negligibly small. When the accumulation state of FIG. 3 is again presented, the electron of the excess charge, which was trapped under the depletion state of FIG. 4, is recombined with the hole excited from the substrate with the result that the electron of the excess charge is drained out as the majority carrier (hole) current. Thus, if the states described in connection with FIGS. 3 and 4 are presented repeatedly and alternately, the excess charges can be drained or pumped out. The absorption (recombination) capacity of the excess carrier per one cycle i.e. pumping capacity per one cycle is about $1 \times 10^2/\mu m^2$.

According to this invention, the excess charges are cancelled by the above pumping operation.

Figure 5:
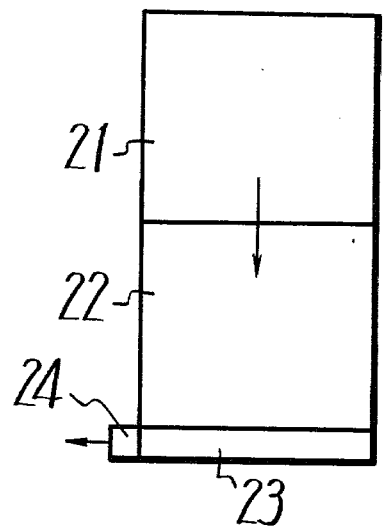
FIG. 5 is a plan view showing a solid state image sensorsensor of the frame transfer system used for the explanation of the invention.

Now, an example of the invention will be hereinafter described in detail. First, this invention is applied to a surface channel charge transfer device and an image sensor of the frame transfer system, as may be well known and as shown in FIG. 5, a solid state image sensor of the frame transfer system is formed of an image portion 21 which obtains a charge pattern in response to an optical image to be picked up or the received light amount, a storage portion 22 which temporarily stores the charge pattern or video information from the image portion 21, and a horizontal shift register 23 which transfers the signals from the storage portion 22 sequentially to an output detecting portion 24, for example, at every horizontal line. In this case, the above elements are formed on a common semiconductor substrate.

Figure 6:
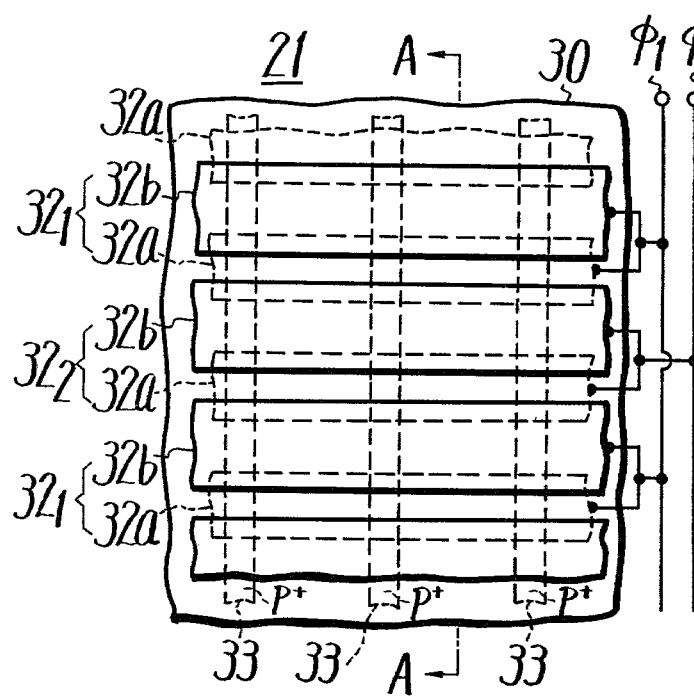
FIG. 6 is a plan view showing, in an enlarged scale, the essential part of an example of the charge transfer device according to the invention.
Figure 7:
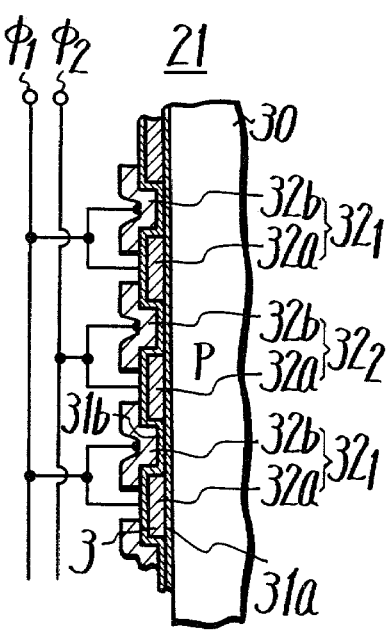
FIG. 7 is a cross-sectional view taken on the line A—A in FIG. 6.

The image portion 21 is formed as a two-phase clock type, as shown in FIG. 6 which is a plan view of its essential portion in an enlarged scale and FIG. 7 is the cross-sectional view on the line A—A in FIG. 6. In this case, there is provided a semiconductor substrate 30 of one conductivity type, for example, a silicon substrate of the P-type with an impurity concentration of, for example, $5 \times 10^{14}/cm^3$. On the surface of the silicon substrate 30 there is coated a first insulating layer 31a made of, for example, $SiO_2$ and on the first insulating layer 31a there are formed first electrodes 32a of a band-shape which are elongated, for example, in the horizontal direction parallel and are with one another with a predetermined distance between adjacent ones. A second insulating layer 31b made of, for example, $SiO_2$ is formed covering the first electrodes 32a and also the first insulating layer 31a between the adjacent first electrodes 32a. Then, second electrodes 32b, each being band-shape and elongated in the horizontal direction, are coated on parts of the second insulating layer 31b beneath which there exist parts of the first insulating layer 31a and which portions are thicker. In this case, the respective second insulating layers 32b are elongated in the horizontal direction with a predetermined distance between adjacent ones. The adjacent first and second electrodes 32a and 32b are connected electrically and every other electrode pair, each consisting of the first and second electrodes 32a and 32b, is electrically connected to form electrode pairs $32_1$ and $32_2$, and voltages $\phi 1$ and $\phi 2$ are applied to the electrode pairs $32_1$ and $32_2$, respectively. In this case, with respect to the electrode pairs $32_1$ and $32_2$, common voltages are applied to the first and second electrodes 32a and 32b of the respective electrode pairs $32_1$ and $32_2$. But, the thickness of the insulating layers beneath the first electrode 32a is selected as 1400 Å and that beneath the second electrode 32b is selected as 2400 Å, so that, as described in connection with FIG. 1, the surface potential of the substrate 30 (minimum potential) under the first and second electrodes 32a and 32b becomes asymmetrical with respect to the direction of the electrodes i.e. transfer direction of the charge.

Channel stopper regions 33, which have the same conductivity type as that of the substrate 30 but sufficiently higher impurity concentration as compared with the latter and each of which is band-shaped, are formed on the substrate 30 in the direction intersecting the elongating direction of the respective electrodes 32a and 32b, for example, in the vertical direction with a predetermined distance between adjacent ones and facing the surface of the substrate 30. Thus, a charge transfer channel is defined by a region between the adjacent channel stopper regions 33. An optical image to be picked up is projected on the image portion 21 on the side of the substrate 30 on which the electrodes 32a and 32b are formed or on the other side thereof. When the optical image is projected on the substrate 30 from the side on which the electrodes 32a and 32b are formed, the electrodes 32a and 32b are made of transparent electrodes, respectively.

According to the present invention, during the storage period of the image portion 21 for the received light, a special process is carried out for the image portion 21 to remove excess carriers or to achieve the pumping operation for the excess carriers based upon the theory set forth above. According to the invention, as shown in FIG. 8 which shows the relation between voltages $\phi 1$ and $\phi 2$ applied to the respective electrode pairs $32_1$ and $32_2$, FIG. 9A which shows a cross-sectional view of the image portion 21 which is substantially the same as shown in FIG. 7, and FIGS. 9B and 9C which are the surface potential diagrams of the image portion 21 at the respective states, the voltage $\phi 2$ applied to one electrode pair $32_2$ is selected as a positive predetermined voltage $V_{\phi 2H}$, for example, $+10$ V in the light receiving and storing period of t1 to t2, for example, in every other frame period (which will be referred to as an A-frame period) of t1 to t3 to form a potential well i.e. storage portion s for the minority carrier in the substrate portion corresponding to the underside of the first electrode 32a and one electrode pair $32_2$ as shown in FIGS. 9B and 9C. Thus, the charge carrier i.e. information charge which may be generated by light reception is stored in the respective storage portions s which are hatched in the figures. In this case, the stored amount of the charge by the respective storage portions s is determined by the potential difference $\Delta E$ between the regions beneath the electrodes 32a and 32b of the respective electrode pair $32_2$ and charges exceeding the difference $\Delta E$ becomes an excess charge f. During the time interval of t1 and t2, the electrodes 32a and 32b of the other electrode pair $32_1$ are supplied with a negative predetermined voltage $V_{\phi 1L}$, for example, $-5$ V to make the surface of the substrate corresponding to the under portion of the electrodes of the electrode pair $32_1$ into an accumulation state. Thus, there is provided a period $\tau_a$ in which the recombination, described in connection with FIG. 3 is carried out, and a period $\tau_b$ in which a positive predetermined voltage $V_{\phi 1M}$, for example, $+5$ V is applied to the electrode pair $32_1$ to give the surface of the substrate corresponding to the under portion of the electrode pair $32_1$ with a potential which will form a depletion or inversion state and the excess carrier f is trapped by the surface state which is made vacant by the previous recombination. In this case, these periods $\tau_a$ and $\tau_b$ are repeated. FIG. 9B shows the state in the period $\tau_a$ and FIG. 9C shows the state in the period $\tau_b$, respectively.

During the light receiving and storing period of t1 to t2, there are provided barriers formed by at least the potentials under the second electrodes 32b of the electrode pairs $32_1$ which prevent the charge carriers in the respective storage portions s from being transferred mutually as shown in FIGS. 9B and 9C.

During the period of t2 to t3 after the light receiving and storing period of t1 to t2, for example, the vertical blanking period of a television image, the charge is transferred from the image portion 21 to the information storage portion 22 in the usual manner by two-phase clock voltages applied to the electrode pairs $32_1$ and $32_2$ and from the latter to the former and to transfer the charge carrier to the information storage portion 22 shown in FIG. 5 along the vertical line defined between the adjacent channel stopper regions 33 shown in FIG. 6.

During the light receiving and storing period of t3 to t4 in the following frame period (which will be referred to as a B-frame), as shown in FIG. 8, voltages $\phi 1$ and $\phi 2$ which are opposite in voltage relation to that of the voltages $\phi 1$ and $\phi 2$ in the light receiving and storing period of t1 to t2 in the prior A-frame period are applied to the electrode pairs $32_1$ and $32_2$ to form a storage portion s under the first electrode $32a$ of the electrode pair $32_1$ which is different from the electrode pair $32_2$ which forms the storage portion s under its electrode $32a$ in the A-frame period. In the B-frame, during the period $\tau_a$ the accumulation state is formed under the electrode pair $32_2$ and during the period $\tau_b$ the depletion state is formed. That is, the voltage $\phi 2$ applied to the electrode pair $32_2$ is selected to be a voltage such that the voltages applied during the periods $\tau_a$ and $\tau_b$ are repeated.

During the interval of t4 to t5 after the light receiving and storing period of t3 to t4, the two-phase clock voltages $\phi 1$ and $\phi 2$ are used to transfer the charge to the image storage portion 22.

Since the image storage portion 22, horizontal shift register 23 and output detecting portion 24, which are provided at the rear stage of the image portion 21, are substantially the same as those of the prior art solid state image sensor of the frame transfer system in construction and operation, their description will be omitted.

As described above, according to the construction of the present invention, there is provided a storage portion which stores the charge carrier (minority carrier) generated by the light image projected thereon during the respective light receiving and storing period as usual, and adjacent the storage portion there is provided a portion in which the pumping action i.e. accumulation state and the depletion state are repeated, to repeatedly carry out the recombination of the charge trapped by the surface state and the trap of the excess charge f by the surface state. In other words, means are provided for cancelling the excess carriers. Thus, the blooming caused by the excess carriers can be avoided effectively.

As described above, in the present invention there is provided the means for cancelling the excess carriers. In this case, the excess carriers, (minority carriers) are drained out finally as the majority carrier current from the substrate, and it is avoided that the excess carrier approaches the other storage portions so that the other storage portions would be adversely affected to cause the blooming phenomenon. Further, there is of no need in this invention as there is in the prior art to have an over-drain region, for a region which is different in the conductivity type of the substrate be provided, so that the integration density can be improved.

In the example of the invention described above, the charge amount dealt by the storage portion s i.e. saturation charge amount is defined by the potential difference $\Delta E$ between those under the electrode forming the storage portion s and the electrodes connected common to the former as shown in FIGS. 9B and 9C. It is, however, possible that, as shown in FIG. 8 by the dotted line, the voltages $\phi 1$ and $\phi 2$ of the period $t_b$ in the light receiving and storing periods of t1 to t2 and t3 to t4 are selected as a voltage $\phi s$ higher than the voltages $V_{\phi 2H}$ and $V_{\phi 1H}$ applied to the electrode pair which form the storage portion s, for example, $+12$ V higher than $+10$ V to restrict the amount of charge. That is, by way of example, as to the light receiving and storing period in the A-frame, during the period $\tau_a$ the surface potential state similar to that shown in FIG. 9B is formed as shown in FIG. 9D, but during the period $\tau_b$ a barrier of $\Delta E_b$ is formed under the second electrode $32b$ of the electrode pair $32_1$ for the storage portion s as shown in FIG. 9E. At this time (in the period $\tau_b$), the voltage is selected higher than the voltage $\phi 2$, so that the barrier $\Delta E_b$ is smaller than the barrier $\Delta E$ under the second electrode $32b$ of the electrode pair $32_2$. Accordingly, the handling charge amount in the storage portion s is determined by the barrier $\Delta E_b$, and hence the excess charge f goes over the barrier $\Delta E_b$ and then is trapped by the surface state under the first electrode $32a$ of the electrode pair $32_1$. The cancellation of the excess charge is carried out by the pumping operation similar to as described the above to drain out the excess carrier from the substrate as the majority carrier current. In case of restricting the handling charge amount by the storage portion s at the pumping side, the saturation charge amount can be set by selecting the magnitude of the barrier $\Delta E_b$ or voltage $\phi s$, so that a so-called $\gamma$-correction (gamma correction) and AGC can be carried out by controlling the voltage $\phi s$.

The example of the invention shown in FIGS. 6 to 9 is of the two-phase clock construction, but the present invention can be formed of a four-phase clock type, three-phase clock type or other various clock types. For example, in the case of three-phase clock type, as shown in FIG. 10 which shows it essential portion in plan view, and FIG. 11 which is a cross-sectional view taken on the line A—A in FIG. 10, on the surface of a semiconductor substrate 30, for example, silicon substrate there is coated the SiO$_2$ insulating layer 31 of a uniform thickness, for example, 1200 Å. On the insulating layer 31 there are provided band-shaped electrodes which are elongated in the horizontal direction in parallel with each other with a predetermined distance between adjacent ones. In this case, every second electrode is connected to form three electrode pairs $32_1$, $32_2$ and $32_3$ and voltages $\phi 1$, $\phi 2$ and $\phi 3$ are applied to the respective electrode pairs $32_1$, $32_2$ and $32_3$.

These voltages $\phi 1$, $\phi 2$ and $\phi 3$ are selected as follows: As shown in FIG. 12, by way of example, the voltage $\phi 1$ which is applied to the electrode $32_1$ during the light receiving and storing period of t1 to t2 is selected as a negative predetermined voltage $V_{\phi 1L}$, for example, $-5$ V to keep the surface of the substrate beneath the electrode $32_1$ in an accumulation state; the voltage $\phi 2$ which is applied to the electrode $32_2$ during the period of t1 to t2 is selected as a negative predetermined voltage $V_{\phi 2L}$, for example, $-5$ V to make the surface of the substrate beneath the electrode $32_2$ be in an accumulation state and to apply the pumping voltage in which the period $\tau_a$, during which the recombination operation described in connection with FIG. 3 is carried out, and the period $\tau_b$, during which a positive predetermined voltage $V_{\phi 2M}$, for example, $+5$ V is applied to make the excess carriers trapped by the surface state which are made vacant by the previous recombination operation described in connection with FIG. 4, are repeated; and the voltage $\phi 3$ which is applied to the electrode $32_3$ is selected as a positive predetermined voltage $V_{\phi 3H}$, for example, $+10$ V to form a potential well on the surface of the substrate beneath the electrode 32₃ and hence to form the storage portion s for storing the information charge.

FIGS. 13B and 13C are potential diagrams of the device with the cross-section shown in FIG. 13A in the periods $\tau_a$ and $\tau_b$. In the state of FIG. 13B i.e. period $\tau_a$, the substrate portion corresponding to the portions under the electrodes 32₁ and 32₂ are held in the accumulation state, so that the charge trapped by the surface state is recombined to be eliminated. In the state of FIG. 13C i.e. period $\tau_b$, the excess carrier f is trapped by the vacant surface state beneath the electrode 32₂. This trapped excess carrier is recombined in the next state of FIG. 13B and cancelled. The above operation will be repeated to carry out the pumping operation for the excess carrier. Thus, the excess charge carriers are cancelled. The transfer of the signal charge from the light receiving and storing portion to the information storage portion is achieved by applying three-phase clocks $V_{\phi 1H}$, $V_{\phi 2H}$ and $V_{\phi 3H}$ to the respective electrodes in the period of t2 to t3. In this case, even during the light receiving and storing period of t3 to t4 in the B-frame, the voltages similar to those applied in the period t1 to t2 are applied to the respective electrodes to carry out the cancellation of excess charge carriers.

Next a case where the present invention is applied to a solid state image sensor or image pick-up device of 1-dimension, a so-called line sensor will be described. FIG. 14 is a schematic diagram showing one example of the above image pick-up device. In this example, a plurality of storage portions or light receiving and storing portions 41a, which may receive a light image and store the charge carrier generated by the light reception, are aligned on one line to form an image sensor portion 41, and shift registers 42A and 42B are provided along both sides of the image sensor portion 41, respectively, to form an image pick-up device of a dual channel type. In the image pick-up device of the dual channel type, the charge carriers i.e. information charges generated by the light reception of every other light receiving and storing portion 41a are transferred to the shift register 42A or 42B and then to an output circuit 43 alternately. Then, the information charge is sequentially read-out therefrom.

FIG. 15 is a plan view showing, in an enlarged scale, the essential part of an example of the 1-dimension image pick-up device of dual channel type according to the present invention, FIG. 16 is a cross-sectional view taken on the line A—A in FIG. 15 and FIG. 17 is a cross-sectional view taken on the line B—B in FIG. 15, respectively.

This dual channel 1-dimension image pick-up device is formed of a semiconductor substrate, for example, a P-type silicon substrate 50 with an impurity concentration of $5 \times 10^{14}/cm^3$, and an insulating layer 51 made of SiO₂ having a thickness of 1200 Å is coated on the surface of the substrate 50. A channel stopper region 53, which is of the same conductivity type as the substrate 50 but higher in impurity concentration, is formed on the surface of the substrate 50. This channel stopper region 53 consists of band-shaped portions 53a, which are arranged parallel with one another and in the direction to cross the respective light receiving and storing portions 41a i.e. extending direction of the sensor portion 41 so as to separate the respective light receiving and storing portions 41a, and portions 53b, which are extended along the extending direction of the sensor portion 41 to connect one end of the adjacent portion 53a. In this case, the respective portions 53b connect different ends of every other portions 53a to form a zig-zag pattern of the channel stopper region 53 as a whole.

For example, a transparent sensor electrode of a band-shape or so-called photo-gate electrode 54 is coated on the insulating layer 51 to cross the portions gripped by the portions 53a of the channel stopper region 53 along the center of the substrate 50, and on the layer 51 along the both sides of the photo-gate electrode 54 there are provided pump electrodes 55A and 55B and on the layer 51 there are coated transfer gate electrodes 56A and 56B, respectively.

Shift registers 42A and 42B are located outside the portions 53b of the channel stopper regions 53. The shift registers 42A and 42B may be of a surface channel type or buried channel type and also of 2-phase clock type, 3-phase clock type, 4-phase clock type and so on, but they are so arranged that the respective bit corresponds to every other light receiving and storing portion 41a. In the illustrated example, the shift registers 42A and 42B are formed of 2-phase clock buried channel type charge transfer elements. Thus, as shown in FIGS. 15 and 17, first insulating layers 51a, each made of, for example, SiO₂ and having the thickness of 2400 Å, are coated on the surface of the substrate 50, and first electrodes 57a are formed on the first insulating layer 51a with a predetermined distance between adjacent ones. The respective first electrodes 57a are located such that they are positioned on the portions corresponding to the portions between the adjacent portions 53a of the channel stopper region 53 and oppose one another through or not through the portions 53b. Second insulating layers 51b, each made of, for example, SiO₂ and having the thickness of 1200 Å, are coated on the surface of the substrate 50 between adjacent first electrodes 57a, and second electrodes 57b are formed on the second insulating layers 51b, respectively. Adjacent first and second electrodes 57a and 57b are connected together, and every other electrode pair, each formed of the electrodes 57a and 57b, is electrically connected to form two pairs of electrodes 57A1, 57A2 and 57B1, 57B2 which correspond to the respective shift registers 42A and 42B, respectively. In FIGS. 16 and 17, 58 designates a buried channel region provided on the surface of the substrate 50 and which is different from the substrate 50 in conductivity type.

An optical image is projected on the sensor portion 41. In this case, the optical image is projected from the side of the substrate 50 on which the sensor portion 41 is provided. Thus, the sensor electrode 54 is made as a transparent electrode.

Figure 19A:
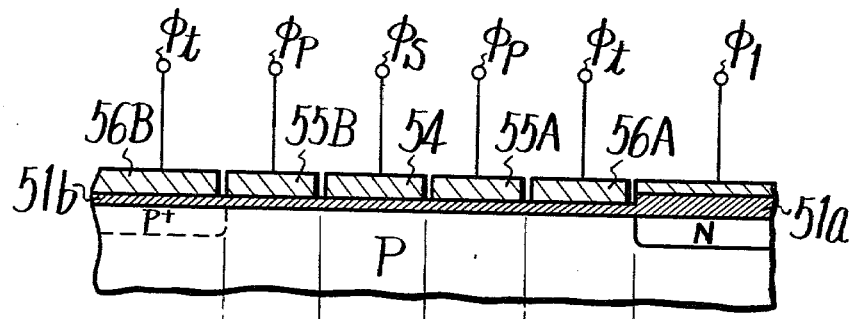
FIG. 19 is a potential diagram used for explaining an operation of the example shown in FIGS. 14 to 17.

Now, the operation of 1-dimension image pick-up device will be described with reference to FIG. 18 which is a diagram showing voltages applied to the respective electrodes and FIGS. 19B, 19C and 19D which show minimum potentials on the cross-section of FIG. 19A which is substantially the same as FIG. 16 on the line A—A of FIG. 15. In this case, a voltage $\phi s$ applied to the sensor electrode 54 forms potential wells for the minority carrier in the respective portions 41a of the sensor portion 41 in all the period and a positive predetermined voltage Vs, which will make the portion to be in a state to store the minority carrier, is selected as, for example +15 V. A voltage $\phi t$, which will be applied to the transfer gate electrodes 56A and 56B during the light receiving and storing periods of t1 to t2, t3 to t4, . . . , is selected as $V_{tL}$, for example, 0V which will make the substrate surfaces beneath the electrodes 56A and 56B form the barriers for the minority carrier. A voltage $\phi_P$, which will be applied to the pump electrodes 55A and 55B during the periods of t1 to t2, t3 to t4, ..., is selected as a voltage such that the period $\tau_a$, in which a negative predetermined voltage $V_{PL}$, for example, $-5$ V is applied for causing the substrate surfaces beneath the electrodes 55A and 55B to be in an accumulation state, and the period $\tau_b$, in which a positive predetermined voltage $V_{PM}$, for example, $+5$ V is applied for making the same substrate surfaces in a depletion or inversion state, will be repeated. The periods of t1 to t2, t3 to t4, ... correspond to such periods in which the shift registers 42A and 42B sequentially transfer the information charges to the output circuit 43, so that during the periods of t1 to t2, t3 to t4, ... voltages $\phi_{1A}$, $\phi_{2A}$ and $\phi_{1B}$, $\phi_{2B}$, which are applied to two pairs of electrodes 57A1, 57A2 and 57B1, 57B2, of the shift registers 42A and 42B, respectively, are selected to be 2-phase clock voltages.

During the periods to t2 to t3, t4 to t5, ..., the charge carrier is transferred from the sensor portion 41 to the shift registers 42A and 42B. Thus, during these periods t2 to t3, t4 to t5, ..., the voltage $\phi t$ applied to the transfer gate electrodes 56A and 56B is selected as a positive predetermined voltage $V_{tH}$, for example +15 V and the voltage $\phi P$ applied to the pump electrodes 55A and 55B is selected as a positive predetermined voltage $V_{PH}$, for example +10 V which is higher than the pumping voltage $V_{PM}$ applied to the pump electrodes 55A and 55B. The voltages $\phi_{2A}$ and $\phi_{1B}$, which are applied to the pair of electrodes of the shift registers 42A and 42B corresponding to every other light receiving and storing portion 41a or electrodes 57A2 and 57B1 in the illustrated example, are selected as a positive predetermined voltage $V_{CH}$. For example, $+20$ V which will make the minimum potentials of the buried channel beneath the electrodes to be a potential such as to be capable of storing the information charge (minority carrier).

Figure 19B:
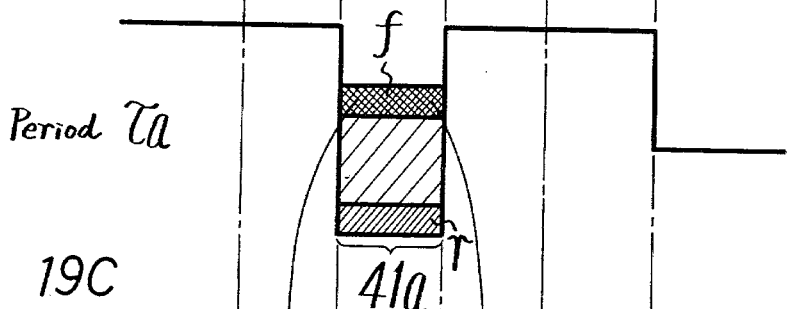
Figure 19C:

As a result, in the light receiving and storing periods of t1 to t2, t3 to t4, ..., a potential well is formed in the light receiving and storing portion 41a beneath the sensor electrode 54 as shown in FIGS. 19B and 19C. Therefore, the information corresponding to the received light amount is stored therein. During the period $\tau_a$ within the periods of t1 to t2, t3 to t4, ..., the substrate surfaces beneath the pump electrodes 55A, 55B and the transfer electrodes 56A, 56B are made in an accumulation state, and hence there is formed the barrier which will prevent the charge carrier in the storage portion 41a from being transferred and also there is carried out such an operation to recombine the charge trapped by the surface state as described in connection with FIG. 3. During the next period $\tau_b$, the substrate surfaces in the regions beneath the electrodes 55A and 55B adjacent the portion 41a become the depletion state as shown in FIG. 19C, and the excess carrier f in the storage portion 41a is trapped by the surface state which is vacant by the previous recombination operation as explained in connection with FIG. 4, and then cancelled by the recombination in the following period $\tau_a$. That is, there is provided a means such that the excess carrier f in the storage portion 41a is subjected to the pumping operation by the above repetition of periods $\tau_a$ and $\tau_b$ at the portions adjacent the storage portion 41a and hence cancelled. During the above pumping period, the potential under the transfer gate electrodes 56A and 56B operates to prevent the charge from being transferred from the storage portion 41a to the other portion i.e. shift registers 42A and 42B and also prevents the mutual mixture of charges in the respective storage portions 41a.

Figure 19D:
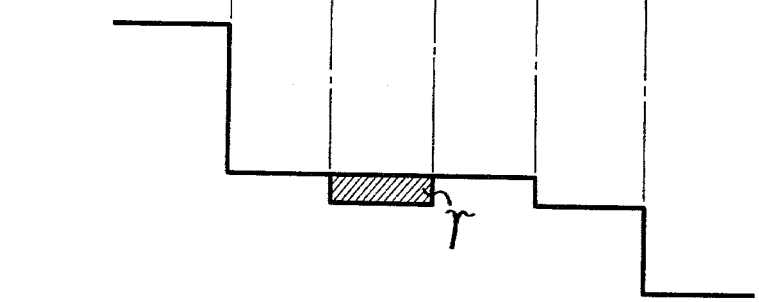

In the next periods of t2 to t3, t4 to t5, ..., as shown in FIG. 19D, the potential barrier in the portion beneath the transfer electrodes 56A and 56B in which no portion 53b of the channel stopper region 53 exists is removed. Thus, the information carrier in the light receiving and storing portion 41a is transferred to the portion beneath the first electrode 57a of the shift registers 42A and 42B.

The information carrier, which is thus transferred to the portions of the shift registers 42A and 42B, is transferred to the output circuit 43 during the next periods of t3 to t4, t5 to t6, ..., by applying 2-phase clock voltages $\phi_{1A}$, $\phi_{2A}$ and $\phi_{1B}$, $\phi_{2B}$ to the electrodes. At this time, the previously mentioned light reception and the corresponding charge storage are simultaneously carried out in the sensor portion 41.

The charge amount stored in the light receiving and storing portion 41a of the sensor portion 41 i.e. the saturated charge amount is set by a difference $\Delta Es$ between the potential in the portion beneath the pump electrodes 55A and 55B adjacent the storage portion 41a in period $\tau_b$ (refer to FIG. 19C) and the potential during the transfer period to the shift registers (refer to FIG. 19D). In the illustrated example, as shown in FIG. 19D, in the storage portion 41a there remains a charge r which is not transferred to the shift registers 42A and 42B, but this charge r has no affect on reading the information because the charge r always remains there.

In the 1-dimension image pick-up device described in connection with FIGS. 16 to 19, there is provided the means for cancelling the excess charge which is formed of the pump electrodes 55A and 55B located along the both sides of the light receiving and storing portion 41a which is separated by the channel stopper region 53. However, the excess charge cancelling means can be formed as shown in FIG. 20 which is a plan view showing, in an enlarged scale, the essential part of another example of the invention. In the example of FIG. 20, the portions 53b of the channel stopper region 53 are formed to have such a width arriving at the portion beneath one of the pump electrode 55A or 55B and hence to form the excess charging cancelling means only at one side of the light receiving and storage portion 41a. By this example, it becomes possible to eliminate the remaining charge r explained in connection with FIG. 19.

Figure 22A:
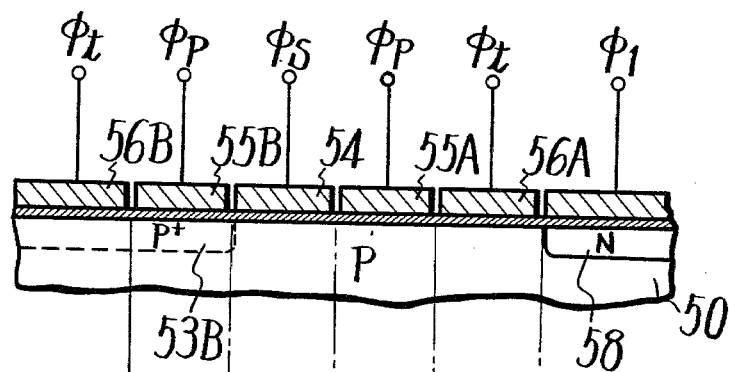
FIG. 22 is a potential diagram used for explaining an operation of the example shown in FIG. 20.

FIG. 21 is a diagram showing voltages applied to the respective electrodes of the example of FIG. 20. FIG. 22A is a cross-sectional view on the line A—A in FIG. 20, and FIGS. 22B, 22C and 22D are diagrams showing the minimum potentials on the cross-section of FIG. 22A, respectively. In this example, the voltage $\phi s$ applied to the sensor electrode 54 is selected as a positive predetermined voltage Vs, for example, $+10$ V during all the periods; the voltage $\phi t$ applied to the transfer gate electrodes 56A and 56B during the light receiving and storing periods of t1 to t2, t3 to t4, ... is selected as a positive predetermined voltage $V_{iL}$, for example, OV similar to the former example; and the voltage $\phi P$ applied to the pump electrodes 55A and 55B during the periods of t1 to t2, t3 to t4, ... is so selected similar to the former example that the periods $\tau_a$ and $\tau_b$, in which negative and positive predetermined voltages $V_{PL}$ and $V_{PM}$, for example, $-5$ V and $+5$ V are applied for pumping, are repeated. At this time, the clock voltages are applied to the shift registers 42A and 42B, respectively.

During the following periods of t2 to t3, t4 to t5, ... in which the information carrier is transferred from the sensor portion 41 to the shift registers 42A and 42B, the voltage $\phi t$ applied to the transfer gate electrodes 56A and 56B is selected as a positive predetermined voltage $V_{tH}$, for example, $+20$ V. At this time, the voltage $\phi P$ applied to the pump electrodes 55A and 55B is selected as a positive predetermined voltage $V_{PH}$, for example, $+15$ V higher than the pumping voltage $V_{PM}$. Further, the voltages $\phi_{2A}$ and $\phi_{1B}$, which are applied to a pair of electrodes of the shift registers 42A and 42B corresponding to every other light receiving and storing portion 41a or electrodes 57A2 and 57B1 in the illustrated example are selected as a positive predetermined voltage $V_{CH}$, for example, $+25$ V.

Figure 22B:
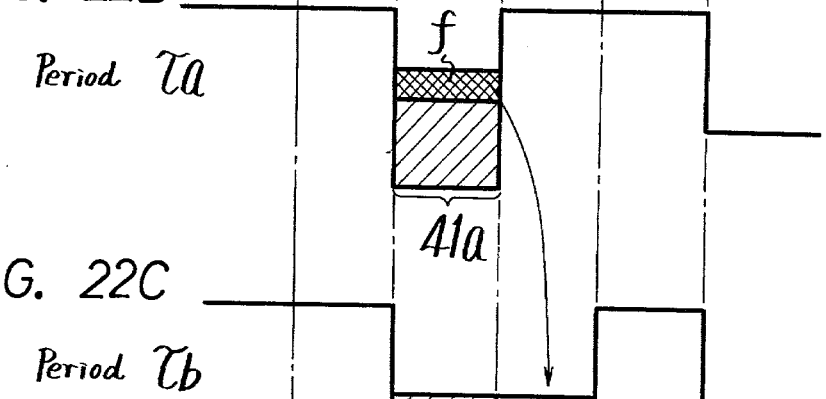
Figure 22C:
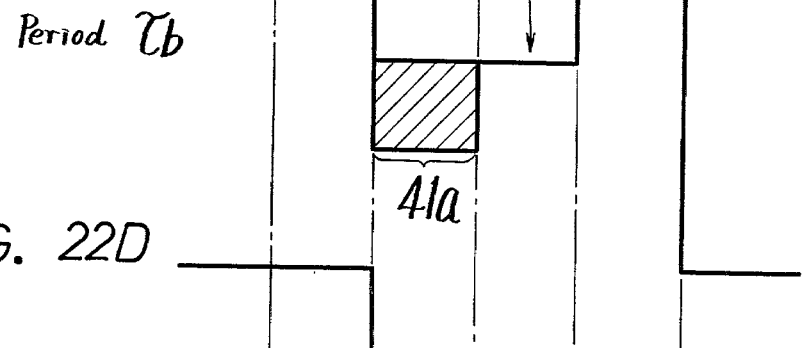
Figure 22D:
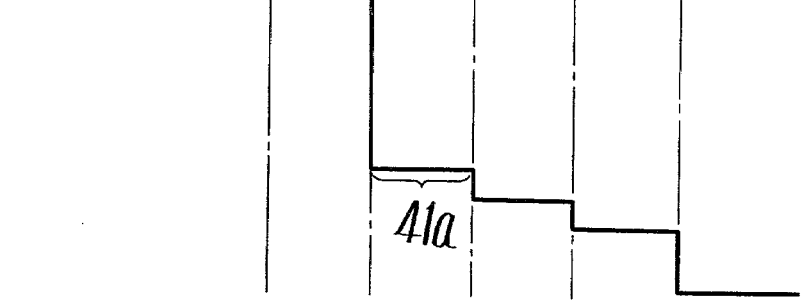

Thus, during the light receiving and storing periods t1 to t2, t3 to t4, ... which are also charge transfer periods in the shift registers 42A and 42B, as shown in FIGS. 22B and 22C and also as described in connection with FIGS. 19B and 19C, the excess carrier f is cancelled by the pumping action. In this example, the excess carrier cancellation is carried out only at one side of the storage portion 41a. During the following periods of t2 to t3, t4 to t5, ..., a step potential shown in FIG. 22D is formed and almost all the information carriers in the storage portion 41a are transferred to the shift registers 42A and 42B.

In the above example, the pumping voltage and the 2-phase clock voltages to the shift registers 42A and 42B are applied as independent voltages, but in some cases it is possible to use one of the 2-phase voltages as the pumping voltage. Accordingly, it is possible that the pump electrode is provided by extending a part of one of the pairs of electrodes of the shift register 42A and-/or 42B.

Next, a case in which the present invention is applied to a 2-dimension image pick-up device of the interline transfer system will be described.

Figure 23:
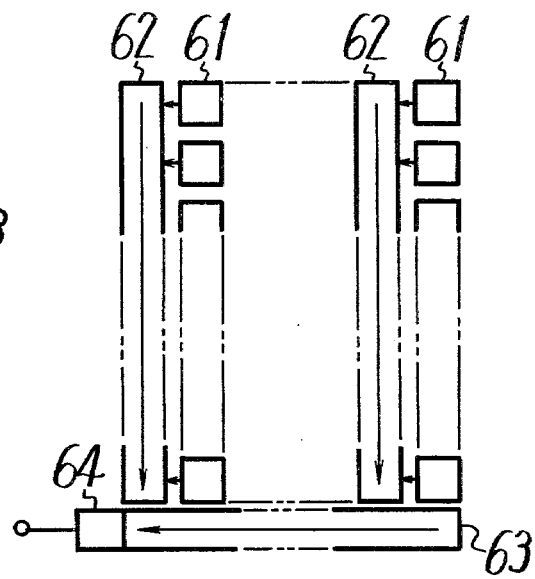
FIG. 23 is a plan view schematically showing a further example of the invention.

A solid state image sensor of the interline transfer system will be generally explained with reference to FIG. 23. This solid state image sensor consists of a plurality of light receiving and storing portions 61, which will receive a light image and store the information charge carrier generated by the reception of the light image and serve as picture elements, and are arranged in row and column directions, i.e. horizontal and vertical directions. Vertical shift register portions 62, each of which is formed of charge transfer elements arranged in a vertical line and located for the light receiving and storing portions 61 on each common vertical line. A horizontal shift register portion 63 which is formed of charge transfer elements is located common to the respective vertical shift register portions 62. In this case, an output circuit 64 is connected to the horizontal shift register 63.

According to the above solid state image sensor, for example, in odd fields, the information charge carriers produced in the light receiving and storing portions on every other horizontal line in response to the received light are transferred to the vertical shift registers 62; the information charge carriers at each horizontal line are transferred from the vertical shift registers 62 to the horizontal shift register 63; the information charge carriers are delivered to the output circuit 64 sequentially from the horizontal shift register 63; and the information signals are sequentially derived from the output circuit 64. In an even field, the information charge carriers in the light receiving and storing portions 61 on the remaining every other horizontal line are transferred to the vertical shift registers 62, then to the horizontal shift register 63, to the output circuit 64 and the information signals are derived sequentially from the output circuit 64 similar to the case of the odd field.

Figure 24:
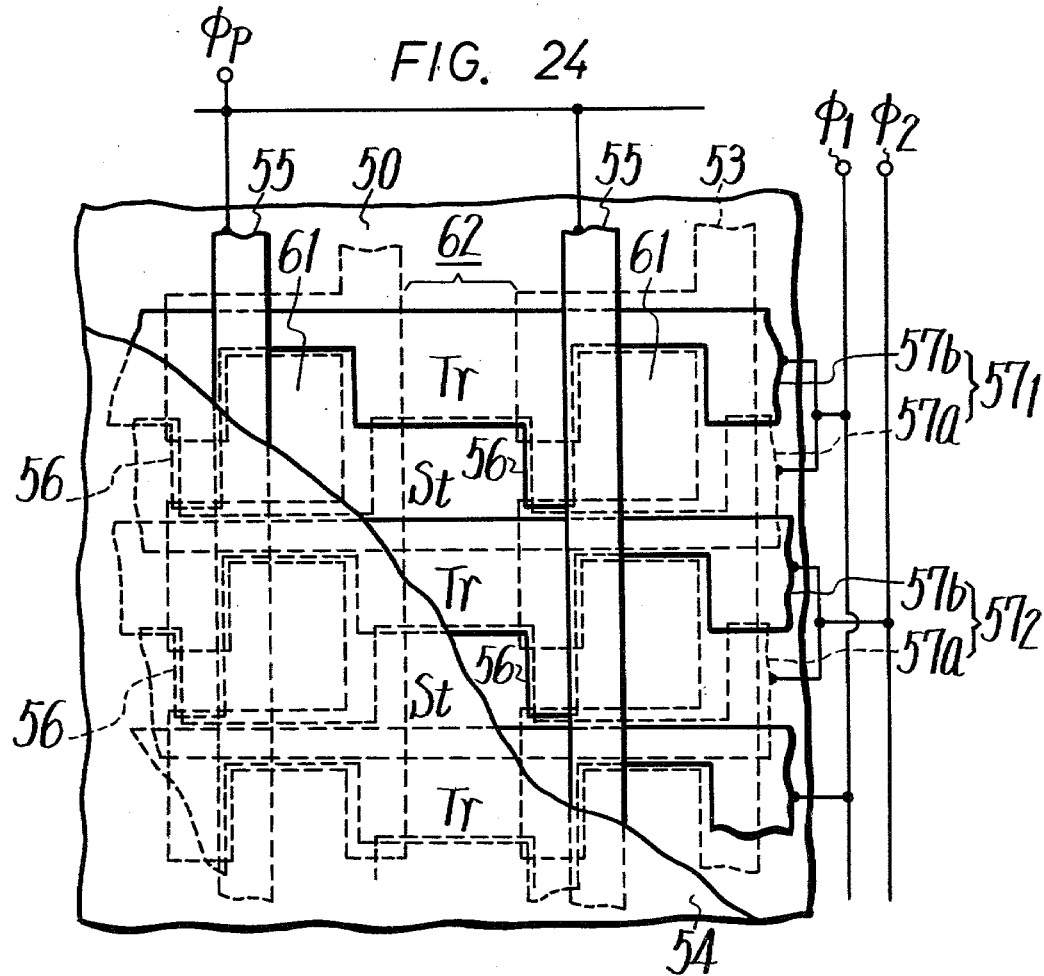
FIG. 24 is a plan view partially taken off and showing in an enlarged scale, the essential part of the example shown in FIG. 23.

FIG. 24 is a plan view showing the essential part of the solid state image sensor of the interline transfer system to which the present invention is applied. In the example of FIG. 24, the construction basically same as that applied to the previous 1-dimension image sensor is employed. In FIG. 24, the parts corresponding to those of FIGS. 15 and 20 are marked with the same references and their detailed explanation will be omitted. In FIG. 24, the light receiving and storing portion 61 and vertical shift register 62 correspond to the light receiving and storing portion 41a and shift registers 42A and 42B of FIGS. 15 and 20, respectively. The channel stopper region 53 is formed so as to separate the respective light receiving and storing portions 61 and the mutual portions of the shift registers 62 connected to the portions 61 except the corresponding portions of the shift registers 62 such that the region 53 is provided to surround the respective portions 61 except their portions connected to the shift registers 62.

In this example, the respective vertical shift registers 62 are formed of the 2-clock type. And, similar to such image sensors, first and second electrodes 57a and 57b on the common horizontal line to the respective shift registers 62 are extended commonly in the horizontal direction, and one bit thereof corresponds to two portions 61 adjacent in the horizontal direction. In each shift register 62, the thickness of the insulating layer beneath the first electrode 57a is selected thicker than that beneath the second electrode 57b, so that a so-called storage portion St for for the charge carrier is formed beneath the first electrode 57a and a so-called transfer portion Tr is formed beneath the second electrode 57b, respectively. Between the storage portion St and the corresponding light receiving and storing portion 61 there is coated a transfer gate electrode 56 to present a portion which will be controlled thereby. In this example, the transfer gate electrode 56 is common to the second electrode 57b. Between the transfer gate electrode 56 and the storage portion 61 there is provided a pump electrode 55 to form an excess charge carrier cancelling means.

The sensor electrode 54 formed on the light receiving and storing portion 61 is made of, for example, a transparent electrode and is common to the respective portions 61, so that the sensor electrode 54 can be coated all over the surface.

The solid state image sensor of the interline transfer system constructed as above can be driven in a manner similar to an ordinary image sensor of this kind. But, the pump electrode 55 is supplied, in the light receiving and storing period, with a voltage $\phi P$ in which the period $\tau_a$, where such a voltage is applied the accumulation state is formed in the portion adjacent the storage portion 61 to recombine the charge trapped by the surface state, and the period $\tau_b$, where such a voltage is applied that the depletion or inversion state is formed to cause to be repeated the excess charge carrier to be trapped by the surface state. Thus, the excess charge carrier in each light receiving and storing portion 61 can be cancelled in a manner similar to that as described in connection with the 1-dimension image sensor.

In the example shown in FIG. 24, the excess charge carrier cancelling means if formed by the pump electrode 55 provided between each of the storage portions 61 and the transfer gate electrode 56. However, it may be possible that the pump electrode 55 is provided at the both sides of each storage portion 61 or only one side of each portion 61 opposite the transfer gate electrode 56 and so on. It is also possible that the pump electrode 55 is provided separately from the other electrodes or common to either one of the electrode pairs of the shift registers 62 and the clock voltage thereto is also used as the pumping voltage. When the clock voltage is used as the pumping voltage or the electrode of the shift register is used as the pump electrode as set forth just above, for example, the width of the channel stopper region 53 between adjacent storage portions 61 on the respective vertical line can be selected to be small. That is, in an ordinary image sensor, it is necessary that the connecting portions of the corresponding electrodes of the respective shift registers lie on the channel stopper region 53 between the storage portions 61 adjacent on the above vertical line. Therefore, in the ordinary image sensor, the width of the region 53 can be reduced and hence it can be avoided that the area is increased by the provision of the excess carrier cancelling means having the pumping action.

The above description describes a case where the excess charge carriers in the charge storage portion at the surface channel are cancelled or a so-called surface channel type pumping structure is provided. However, according to the present invention, even the case where the charge storage portion is made as a buried channel type, the excess charge carriers can be cancelled or a buried channel type pumping construction can be presented.

Figure 25:
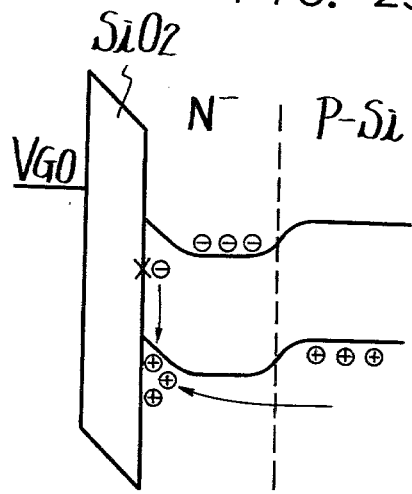
FIGS. 25, 26 and 27 are diagrams used for explaining the mechanism which cancels the excess carrier of a buried channel type.
Figure 26:
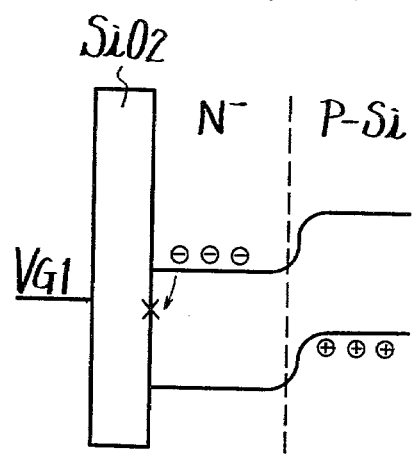
Figure 27:
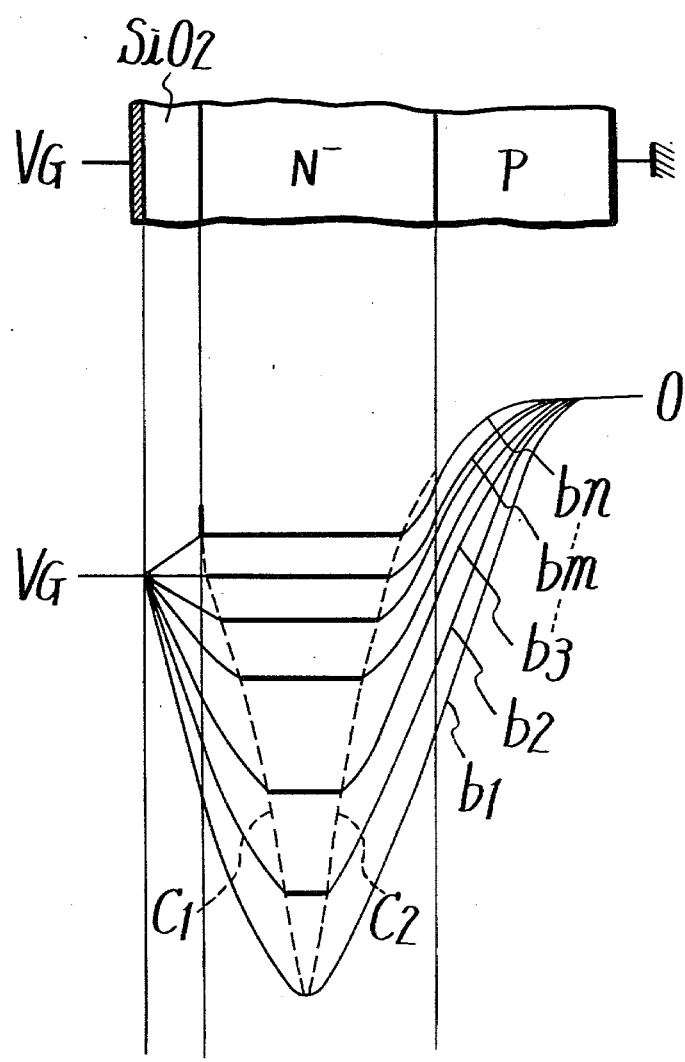

An example of the excess charge carrier cancelling means of the buried channel type pumping structure will be described with reference to FIGS. 25 and 26. FIGS. 25 and 26 show an energy band model of such a construction in which a silicon substrate P-Si of the P-type is provided, an N⁻ layer of a low impurity concentration is formed on the substrate P-Si which faces the surface of the substrate, an insulating layer of SiO₂ is coated on the N⁻ layer, and a gate electrode is formed on the insulating layer. With this structure, a negative predetermined voltage with respect to the N⁻ layer is applied to the gate electrode to form an inversion layer on the surface of the N⁻ layer. Thus, on the surface of the inversion layer, or in fact on the surface of the substrate in the direction perpendicular to the sheet of FIGS. 25 and 26 adjacent the N⁻ layer, there is formed a channel stopper region of the P-type with a high impurity concentration, so that holes (+) of the majority carriers of the substrate provided through the channel stopper region are gathered, and electrons (−) of the majority carrier in the N⁻ layer, which are trapped by the surface state (the center of recombination is shown by x in FIGS. 25 and 26), are rapidly recombined with the holes (+). Thus, almost no electron (−) remains on the surface state. Next, a positive predetermined voltage with respect to the N⁻ layer is applied to the gate electrode to form a flat band state. Thus, if electrons (−) exist on the surface of the N⁻ layer, the electrons (−) are trapped by the vacant surface state. Then, if the inversion state of FIG. 25 is presented again, the electrons (−) trapped on the surface state are recombined with the holes (+) and then cancelled. Accordingly if the electrons (−) existing on the N⁻ layer are an excess charge carrier, this excess charge carrier can be cancelled by repeating the states of FIGS. 25 and 26. Thus, the pumping action for the excess charge carrier can be performed. In FIG. 26, the flat band state is presented by the voltage at the gate electrode. If, however, such a state, as shown in FIG. 27 is considered in which the gate voltage is kept constant as $V_G$ and charge carriers are stored in the charge storage portion of the buried channel type, as the charge carriers increase, the band model changes as shown by curves b1, b2, b3, ... bm, ... bn and becomes a flat band stage shown by the curve bm when the charge carriers become a certain amount. In this case, the portions of the respective curves b1 to bn between dotted line curves C1 and C2 represent the position on which the carrier can exist, and hence the flat band state occurs which traps carriers arriving at the surface of the N⁻ layer. That is, the amount of carriers which will produce the flat band or the saturation amount of carriers in the buried channel (handling amount) can be defined by the gate voltage $V_G$.

An example of the invention in which the above pumping function in the buried channel type is utilized will be described with reference to FIG. 28. In this example, this invention is applied to a solid state image sensor which is of the buried channel structure of the interline transfer system and whose general construction is substantially same as that shown in FIG. 23.

Figure 28:
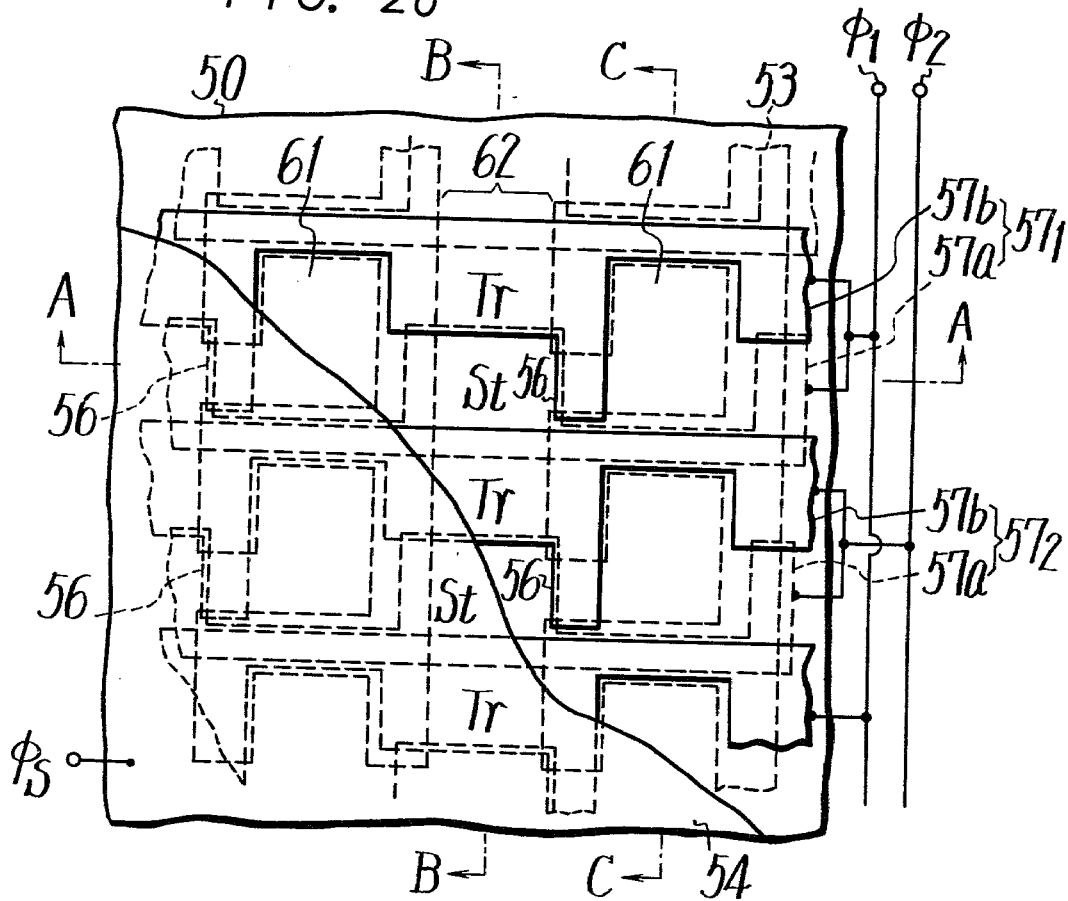
FIG. 28 is a plan view showing the essential part of a further example of the invention.
Figure 29:
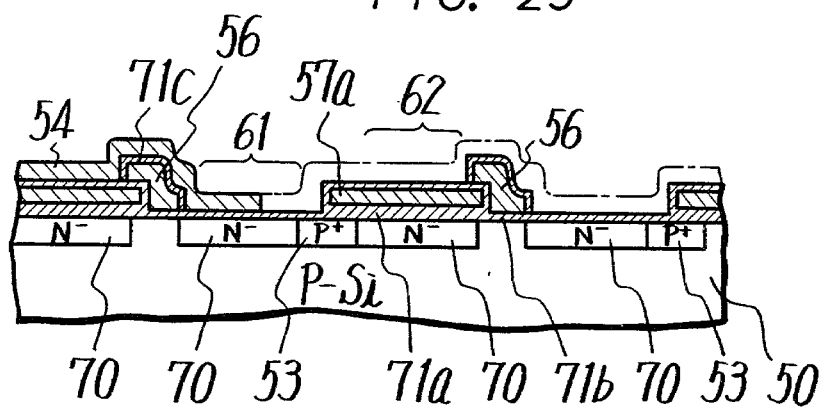
FIGS. 29, 30 and 31 are cross-sectional views taken along the lines A—A, B—B and C—C of FIG. 28.
Figure 30:
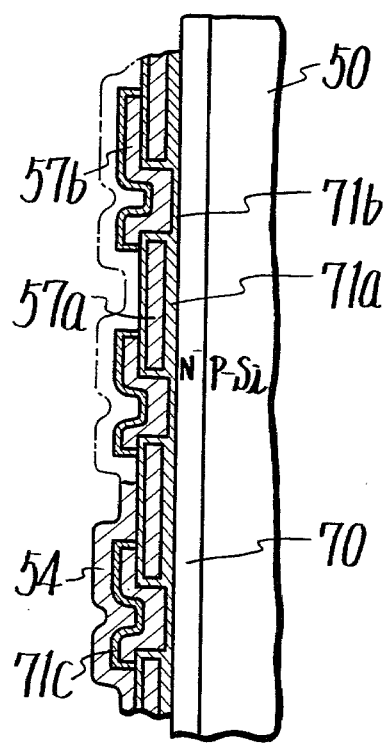
Figure 31:
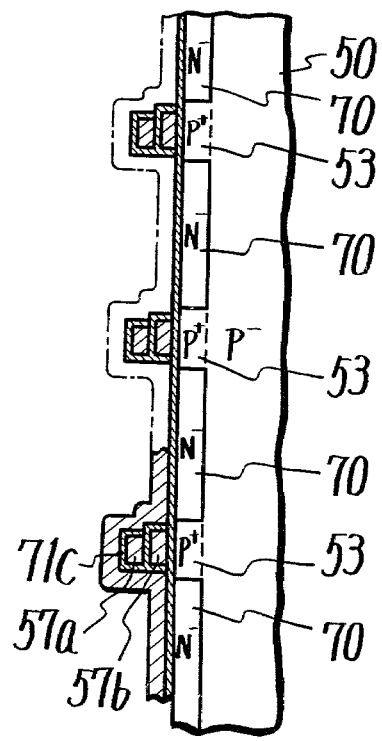

FIG. 28 is a schematic plan view showing a part of light receiving and storing portions 61 and a part of the vertical shift registers 62 corresponding thereto according to this invention, and FIGS. 29, 30 and 31 are cross-sectional views taken on lines A—A, B—B and C—C in FIG. 28, respectively.

In this example of the invention, facing the surface of a semiconductor substrate 50 of one conductivity type for example, a P-type silicon substrate or facing one major surface thereof, there is provided a channel stopper region 53 with a high impurity concentration and the same conductivity type as that of the substrate 50. In the example, the channel stopper region is provided with a high impurity concentration p⁺, and substrate (P region) extends to the surface of the substrate works as a channel stopper for N type buried channel region. This channel stopper region 53 is provided, similar to that shown in FIG. 24, so as to separate the respective light receiving and storing portions 61 and also the mutual portions of the shift registers 62 except their corresponding portions to be connected to the portions 61 and hence to surround the respective portions 61 except their connecting portions to the shift registers 62.

Under the respective portions which are surrounded by the channel stopper regions 53 to form the regions 61 and under the portions which will form the vertical shift registers 62, regions 70 are selectively provided which face the surface of the substrate 50 and form a buried channel of a different conductivity type from the substrate 50 i.e. N-type conductivity type.

In this example, the shift register 62 is also formed of the 2-phase clock type. First and second electrodes 57a and 57b on the common horizontal line are provided and extend in the horizontal direction of the respective shift registers 62. In each shift registers 62, a first insulating layer 71a is provided beneath the first electrode 57a, and a second insulating layer 71b, which is thinner than the first insulating layer 71a, is provided beneath the second electrode 57b to make the potentials under the respective electrodes 57a and 57b different in depth. Thus, in the potential of the buried channel i.e. minimum potential, there is formed a so-called storage portion St under the first electrode 57a in which a potential well is formed for the minority carrier (information charge carrier), and there is produced a transfer portion Tr under the second electrode 57b in which a potential barrier is formed for the potential well. On the portion between the respective storage portion St and the corresponding light receiving and storing portion 61, there is provided a transfer gate electrode 56 integrally extended from, for example, second electrode 57b. In this case, also a sensor electrode 54 provided on the storage portions 61 is made of, for example, a transparent electrode and is coated over an insulating layer 71c on the storage portions 61.

According to the invention, the sensor is subjected to a special operation to cause the function explained in connection with FIGS. 25, 26 and 27 and hence to cancel the excess carrier. In this example, the first and second electrodes 57a and 57b of the shift registers 62 provided in correspondence with the respective storage portions 61 are connected together to form two pairs of electrodes $57_1$ and $57_2$ as usual.

FIG. 32 is a graph showing the timing among voltage $\phi 1$, $\phi 2$ applied to the electrode pairs $57_1$, $57_2$ and a voltage $\phi s$ applied to the sensor electrode 54; FIG. 34A is a cross-sectional view substantially on the A—A in FIG. 28; FIGS. 33 B1, 33 C1 and 33 D show minimum potentials on the cross-section of FIG. 33A; and FIGS. 33 B2 and 33 C2 are band model diagrams on the cross-section of the sensor region, respectively.

Periods of t1 to t2, t3 to t4, ... in FIG. 32 correspond to the vertical blanking period of, for example, a television picture. During these periods the information charge carriers in the light receiving and storing portions 61 are transferred to the vertical shift registers 62, and during periods of t2 to t3, t4 to t5, ... the information charge carriers transferred to the vertical shift registers 62 are transferred to the horizontal shift register 63 shown in FIG. 23 and also new light reception and storage of charge carriers produced thereby are carried out during the same periods of t2 to t3, t4 to t5, .... During the transfer periods of t1 to t2, t5 to t6, ... from the storage portion 61 to the shift register 62 just before the transfer periods from the light reception and storage and vertical shift register 62 to the horizontal shift register 63 of, for example, an odd field (A-field), a voltage $\phi 1$ applied to one electrode pair $57_1$ is selected as a positive high voltage $V_{\phi 1H}$, for example, +20 V to form a potential well in the storage portion St beneath the first electrode 57a of the electrode pair $57_1$ in the buried channel of the shift register 62 as shown in FIG. 33D and also to lower the potential barrier under the transfer gate electrode 56 between the storage portion St and corresponding storage portion 61 and hence to transfer the information carrier in the storage portion or that 61 on every other horizontal line. At this time, the voltage $\phi 2$ applied to the other electrode pair $57_2$ is selected as, for example, 0V to avoid that the information charge carrier in the storage portion corresponding to the above electrode pair is transferred to the shift register 62. During the following periods of t2 to t3, t6 to t7, ..., 2-phase clock pulses are applied to the two pairs of electrodes $57_1$ and $57_2$ to transfer the charge carriers in the respective shift registers 62 in the vertical direction. During the charge transfer periods of t3 to t4, t7 to t8, ... from the storage portion 61 to the vertical shift register 62 immediately before the transfer periods of t4 to t5, t8 to t9, ... from the storage and vertical shift register 62 to the horizontal shift register 63 in the following even fields (B-fields), the voltage $\phi 2$ applied to the electrode pair $57_2$ is selected as a large positive predetermined voltage $V_{\phi 2H}$, for example, +20 V to transfer the information charge carrier in every other storage portion 61 to the storage portion St under the second electrode 57b contrary to the case described above relating to periods t1 to t2, t5 to t6, ....

During both the light receiving and storing periods of t2 to t3, t4 to t5, t6 to t7, ... of the A- and B- fields, the voltage $\phi s$ applied to the sensor electrode 54 is selected in this invention not to be a normal constant voltage Vs but the pumping voltage which serves to cancel the excess charge carriers. That is, during the light receiving and storing period, the voltage $\phi s$ is selected as the voltage $V_{sp}$ which will make the surface on the buried channel forming the storage portion 61 i.e. the surface of the buried channel forming the region 70 to be in the state presenting the inversed layer described in connection with FIG. 25. For example, the voltage $V_{sp}$ is selected as $-10$ V to repeat the periods $\tau_a$ and $\tau_b$ in which period $\tau_a$ the charge carrier (electron trapped by the surface state is recombined and in which period $\tau_b$, as described in connection with FIG. 27, a predetermined potential such as $+5$ V is applied to determine the stored amount of carriers forming the flat band in the storage portion 61.

Figure 1:
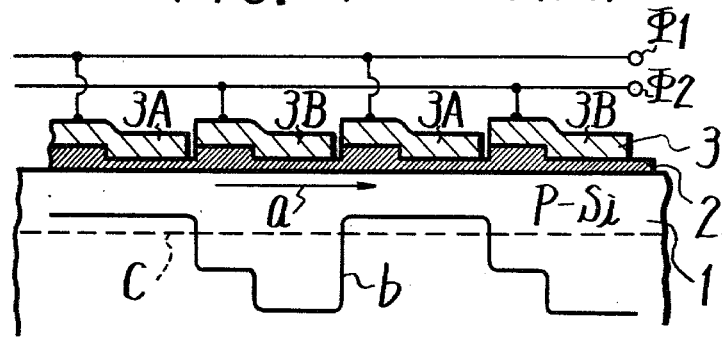
FIG. 1 is a cross-sectional view showing the essential part of a prior art solid state image sensor of a frame transfer system.
Figure 2:
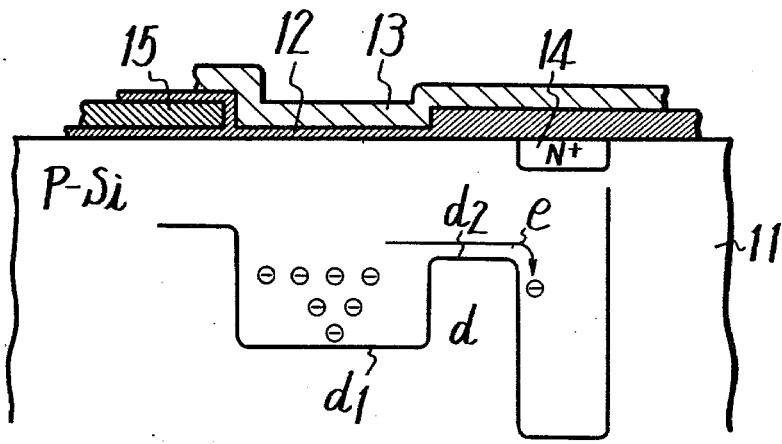
FIG. 2 is a cross-sectional view showing the essential part of a prior art solid state image sensor of the interline transfer system.

FIG. 33A is a cross-sectional view of the sensor; FIGS. 33B1 and 33B2 show a minimum potential diagram of the cross-section of FIG. 33A in the period $\tau_a$ and a band model diagram thereof; and FIGS. 33C1 and 33C2 show a minimum potential diagram in the period $\tau_b$ and a band model diagram, respectively. When a charge carrier (an excess charge carrier), which will cause a minimum potential more than that coincident with the surface potential of the storage portion 61 (i.e. the potential at the buried channel in the storage portion 61), namely a flat band, is produced in the period $\tau_b$ as shown in FIGS. 33B1 and 33B2, the charge carrier arrives at the surface and then is trapped by the surface state which is made vacant in the period $\tau_a$. Thus, the excess charge carrier is cancelled by the repetition of the periods $\tau_a$ and $\tau_b$. As described above, the excess charge carrier is removed, the information charge carrier lower than a predetermined saturation charge amount is transferred during the respective periods of t3 to t4, t7 to t8, ... or t5 to t6, t9 to t10, ... to the shift register 62 as shown in FIG. 33D.

As described above, according to the present invention, since the excess charge carriers can be cancelled, it can be avoided that the excess charge carriers are mixed into the information charge carriers to cause blooming. Further, even in the buried channel type, the excess charge carrier is drained as the majority carrier with respect to the substrate, so that the drawback inherent to the drain out of the excess charges as the minority carrier can be also avoided. When employing the buried channel type structure, the surface of the same position as the buried channel portion becomes the pumping region for the excess charge carrier and it is not required to specially provide the pump electrode, so that the area of the sensor can be reduced and hence the sensor can be manufactured by a simple process.

In the case of the surface channel type pumping structure, when many of the minority carriers exist on the surface of the pumping region, if this surface is brought into an accumulation state rapidly, it may occur that all the carriers except the charge trapped by the surface state can not return to the storage portion and part of the carriers will be drained out in the substrate as the minority carrier. Therefore, in order to avoid this, it is desired that the surface of the pumping portion be brought into the accumulation state with a rising-up time longer than the diffusion response time of the minority carriers.

In the case of buried channel type pumping mechanism, when the surface is inversed, there is generated an electrical field which will attract the majority carriers in the channel forming region 70 (electron when the region 70 is an N− layer) into the inside of the region 70. In this case, since the potential of the region 70 is always lower than that of the substrate, the excess charge carrier will not be drained out as minority carriers.

In the above examples of the invention, the light receiving and storing or storage portions are made as so-called MOS structures. However, even if the storage portion is made as a photo-diode structure, the same effect can be obtained. Further, in place of the channel stopper region 53, other suitable means forming a barrier for the carrier can be used.

It will also be apparent that various modifications and variation could be made for the charge transfer system and so on without departing from the spirits or scope of the novel concepts of the present invention by those skilled in the art. Therefore, the spirits or scope of the invention should be determined by the appended claims only.

I claim as my invention:

1. A charge transfer device comprising:
   (a) a semiconductor substrate of a first conductivity type;
   (b) storage means having a number of storing portions separately provided on said substrate for storing signal charge carriers during a predetermined period;
   (c) transfer means for transferring said signal charge carriers;
   (d) a plurality of barrier means for preventing said signal charge carriers stored in said storing portions from being moved between certain of said storing portions during said predetermined period; and
   (e) means for removing an excess charge carriers exceeding a fixed amount, said means for removing having first and second potential applying means for applying first and second potentials at predetermined regions of said substrate alternately during said predetermined period, said first potential having a value such that charge carriers having opposite polarity to said signal charge carriers which will be recombined with charges trapped at surface states are induced on a surface of said substrate, and said second potential having a value such that excess charge carriers are trapped by said surface states, said first and second potentials being applied a plurality of times during said predetermined period sufficient to remove said excess charge carriers.

2. A charge transfer device according to claim 1 wherein said means for removing excess charge carriers include a plurality of electrodes having first portions separated from said substrate by an insulating layer of a first thickness, and second portions separated from said substrate by an insulating layer having a thickness different from said first thickness.

3. A charge transfer device comprising;
   (a) a semiconductor substrate of one conductivity type, having a surface thereof,
   (b) a plurality of storing portions formed of portions of said semiconductor substrate storing signal charge carriers during a predetermined period,
   (c) a plurality of barrier means for said signal charge carriers for preventing flow of said signal charge carriers between certain of said storing portions during said predetermined time,
   (d) transfer means for transferring said signal charge carriers which are stored in said storing portions, and
   (e) means for removing excess charge carriers exceeding a predetermined capacity of said storing portions, said means having first and second potential applying means for alternately applying first and second potential at portions adjacent to each of said storing portions during said predetermined period, said first and second potential having values so as to make said surface of said substrate in accumulation and depletion states respectively, said first and second potentials being applied a plurality of times during said predetermined time sufficient to remove excess charge carriers.

4. A charge transfer device comprising;
   (a) a semiconductor substrate of first conductivity type having a major surface thereof,
   (b) a plurality of storing portions of second conductivity type opposite to said first conductivity type provided adjacent to said surface of said substrate for storing signal charge carriers during a predetermined period,
   (c) a plurality of barrier means for said signal charge carriers for preventing flow of said signal charge carriers between certain of said storing portions,
   (d) transfer means for transferring said signal charge carriers stored at said storing portions, and
   (e) means for removing excess charge carriers exceeding a predetermined capacity of said storing portions, said means having first and second potential applying means for alternately applying first and second potentials to said storing portions during said predetermined period, said first potential being selected so that charge carriers having opposite polarity to said signal charge carriers which will be recombined with charges trapped at surface states are induced on a surface of said storing portions
   (e) said second potential being selected such that said excess charge carriers can be moved to said surface to be trapped by said surface states, said first and second potentials being applied a plurality of time during said predetermined period sufficient to remove said excess charge carriers.

5. A solid state image sensor device comprising;
   (a) a semiconductor substrate of a first conductivity type having a major surface thereof,
   (b) a plurality of sensor regions associated with said major surface of said substrate, said sensor regions being aligned substantially on one line and collecting signal charge carriers in response to an incident radiation during a predetermined period,
   (e) first and second shift registers associated with said surface and provided on both sides of said line, even numbered sensor regions being connected to said first shift register, odd numbered sensor regions being connected to said second shift register, (d) a channel stopper region separating said sensor regions from each other and separating said even numbered sensor regions from said second shift register and separating said odd numbered regions from said first shift register, (e) a control means between said sensor regions and shift registers which is a potential barrier for said signal charge carriers during said predetermined period, (f) means to remove excess charge carriers of said sensor regions, said means associated with said sensor regions at predetermined areas, and having first and second potential applying means for applying first and second potentials at said predetermined areas of said substrate alternately during said predetermined period, said first potential having a value such that charge carriers having opposite polarity to said signal charge carriers which will be recombined with charge carriers trapped at surface states are induced on a surface of said substrate, and said second potential having a value such that said excess charge carriers are trapped by said surface states, said first and second potentials being applied a plurality of times during said predetermined time sufficient to remove said excess charge carriers.

6. A solid state image sensor device comprising; p1
(a) a semiconductor substrate of a first conductivity type having a major surface thereof, (b) a insulating layer formed on said substrate, (c) an image sensor portion provided on a first portion of said substrate and having a plurality of sensor elements aligned in row and column directions to develop signal charges in response to an incident radiation, (d) a storage portion provided on a second portion of said substrate having a plurality of storage cells aligned in row and column directions to temporarily store said signal charge carriers developed in said sensor portion, and a horizontal shift register to read out line by line said signal charge carriers from said storage portion, (e) barrier means for preventing flow of said signal charge carriers between certain of said storage cells, (f) said sensor portion provided with electrode means on said insulating layer to apply potentials to each of said sensor elements in said substrate during an integration period, said storage portion provided with electrode means on said insulating layer to apply potentials to said substrate, (g) said electrode means for said sensor and said storage portions producing an asymmetrical potential in said row direction to transfer said signal charge carriers in one direction, (h) said electrode means for sensor portion applying a first voltage to produce a potential well to store signal charge carriers at predetermined sensor elements, and a second voltage to produce a potential barrier for signal charge carriers at regions adjacent to said predetermined sensor elements, (i) said electrode means for said sensor portion further applying third and fourth potentials a plurality of times alternately to predetermined portions of said substrate during said integration period, (j) said third potential being selected such that charge carriers having opposite polarity to said signal charge carriers which will be recombined with charges trapped at surface states are induced on a surface of said substrate, and (k) said fourth potential being selected such that said excess charge carriers are trapped by said surface states, said third and fourth potentials being applied a number of times sufficient to remove said excess charge carriers, electrode means for said sensor and said storage portions applying periodical clock voltages to transfer said signal charges in said one direction in said row direction during a period subsequent to said integration period.

7. A solid state image sensor device comprising;
(a) a semiconductor substrate of a first conductivity type having a major surface thereof, (b) a plurality of picture elements provided on said substrate aligned in row and column directions to develop signal charge carriers in response to an incident radiation during a predetermined period, (c) a plurality of vertical shift registers associated with each row of said picture elements to transfer said signal charges in one direction, (d) barrier means for said signal charge carriers preventing flow of said signal charge carriers between said picture elements, means for preventing signal charge transfer from said picture elements to said vertical shift register during said predetermined period, (e) electrode means applying voltages to said substrate for transferring said signal charges and for achieving antiblooming, (f) said voltages including first and second voltages which are applied a plurality of times alternately during said predetermined period to predetermined portions of said substrate, (g) said first potential being selected such that charge carriers having opposite polarity to said signal charge carriers which will be recombined with charges trapped at surface states are induced on a surface of said substrate, and said second potential being selected such that said excess charge carriers are trapped by said surface states, said first and second potentials being applied a number of times sufficient to remove said excess charge carriers.

8. A solid state sensor according to claim 7 wherein said electrode means includes a plurality of electrodes having two portions with first portions separated from said substrate by an insulating layer of a first thickness and the second portions being separated from said substrate by an insulating layer having a second thickness different from said first thickness.

* * * * *